(12) United States Patent
Gamerith et al.

(10) Patent No.: US 9,570,596 B2
(45) Date of Patent: *Feb. 14, 2017

(54) SUPER JUNCTION SEMICONDUCTOR DEVICE HAVING A COMPENSATION STRUCTURE

(71) Applicant: Infineon Technologies Austria AG, Villach (AT)

(72) Inventors: Stefan Gamerith, Villach (AT); Armin Willmeroth, Augsburg (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 14/679,483

(22) Filed: Apr. 6, 2015

(65) Prior Publication Data
US 2015/0214348 A1 Jul. 30, 2015

Related U.S. Application Data

(62) Division of application No. 13/874,840, filed on May 1, 2013, now Pat. No. 9,024,383.

(51) Int. Cl.
*H01L 29/06* (2006.01)
*H01L 29/739* (2006.01)
(Continued)

(52) U.S. Cl.
CPC ....... *H01L 29/7396* (2013.01); *H01L 29/0619* (2013.01); *H01L 29/0634* (2013.01);
(Continued)

(58) Field of Classification Search
CPC ............ H01L 29/7396; H01L 29/0619; H01L 29/7811; H01L 29/0696; H01L 29/1095; H01L 29/7802; H01L 29/66734; H01L 29/7813; H01L 29/0634; H01L 29/0878; H01L 29/66348; H01L 29/7397; H01L 29/063; H01L 29/0623

See application file for complete search history.

(56) References Cited

U.S. PATENT DOCUMENTS 6,546,516 B1 4/2003 Wright et al.
6,576,516 B1 6/2003 Blanchard
(Continued)

FOREIGN PATENT DOCUMENTS

CN 1767211 A 5/2006
CN 101083284 A 12/2007
(Continued)

OTHER PUBLICATIONS

Jones Diffusion in Silicon, ICKnowledge LLC, 2008, pp. 1-10.*
(Continued)

*Primary Examiner* — Galina Yushina
(74) *Attorney, Agent, or Firm* — Murphy, Bilak & Homiller, PLLC

(57) ABSTRACT

A super junction semiconductor device includes a semiconductor portion including mesa regions protruding from a base section and spatially separated in a lateral direction parallel to a first surface of the semiconductor portion, and a compensation structure covering at least sidewalls of the mesa regions. The compensation structure includes at least two first compensation layers of a first conductivity type, at least two second compensation layers of a complementary second conductivity type, and at least one interdiffusion layer between one of the first and one of the second compensation layers.

2 Claims, 22 Drawing Sheets

(51) Int. Cl.
  *H01L 29/78* (2006.01)
  *H01L 29/10* (2006.01)
  *H01L 29/66* (2006.01)
  *H01L 29/08* (2006.01)
  *H01L 29/861* (2006.01)

(52) U.S. Cl.
  CPC ...... *H01L 29/0653* (2013.01); *H01L 29/0696* (2013.01); *H01L 29/0878* (2013.01); *H01L 29/1095* (2013.01); *H01L 29/66348* (2013.01); *H01L 29/66712* (2013.01); *H01L 29/66734* (2013.01); *H01L 29/7397* (2013.01); *H01L 29/7802* (2013.01); *H01L 29/7811* (2013.01); *H01L 29/7813* (2013.01); *H01L 29/861* (2013.01)

(56) References Cited

U.S. PATENT DOCUMENTS

| | | |
|---|---|---|
| 6,630,698 B1 | 10/2003 | Deboy et al. |
| 7,892,924 B1 | 2/2011 | Lee et al. |
| 8,421,152 B2 | 4/2013 | Sasaki |
| 8,455,956 B2 | 6/2013 | Saggio et al. |
| 2003/0232477 A1 | 12/2003 | Deboy et al. |
| 2004/0007736 A1 | 1/2004 | Deboy et al. |
| 2006/0256487 A1 | 11/2006 | Kishimoto et al. |
| 2008/0111207 A1 | 5/2008 | Lee et al. |
| 2008/0203470 A1* | 8/2008 | Willmeroth ......... H01L 29/0634 257/328 |
| 2008/0246079 A1 | 10/2008 | Saito et al. |
| 2010/0059814 A1* | 3/2010 | Loechelt ............ H01L 29/0634 257/330 |
| 2010/0163846 A1* | 7/2010 | Yilmaz ............... H01L 29/7827 257/24 |
| 2011/0101446 A1 | 5/2011 | Guan et al. |
| 2011/0127586 A1* | 6/2011 | Bobde ................ H01L 29/0634 257/262 |
| 2011/0140167 A1 | 6/2011 | Yilmaz et al. |
| 2011/0220992 A1 | 9/2011 | Inomata |
| 2014/0231903 A1 | 8/2014 | Willmeroth et al. |

FOREIGN PATENT DOCUMENTS

| | | |
|---|---|---|
| DE | 10057612 A1 | 5/2002 |
| DE | 10196990 T1 | 10/2003 |
| DE | 102004037153 A1 | 3/2006 |
| DE | 102006025218 A1 | 12/2007 |
| DE | 102007030755 B3 | 2/2013 |
| JP | 2007251023 A | 9/2007 |
| WO | 0038242 A1 | 6/2000 |
| WO | 2008039548 A2 | 4/2008 |

OTHER PUBLICATIONS

Kambiba, R. et al., "Design of Trench Termination for High Voltage Devices", IEEE Proceedings of the 22nd International Symposium on Power Semiconductor Devices and ICs, Hiroshima, Japan, Jun. 6-10, 2010, pp. 107-110.

Moens, et al., "UltiMOS : A Local Charge-Balanced Trench-Based 600V Super-Junction Device", IEEE Proceedings of the 23rd International Symposium on Power Semiconductor Devices and ICs, San Diego, CA, USA, May 23-26, 2011, pp. 304-307.

Schmidt, G. et al., "Vertical Edge Termination with Drain-Sided Field Plate", Siemens AG, 2005, pp. 1-7.

Seto, K. et al., "Universal Trench Edge Termination Design", IEEE Proceedings of the 2012 24th International Symposium on Power Semiconductor Devices and ICs, Bruges, Belgium, Jun. 3-7, 2012, pp. 161-164.

Vanmeerbeek, P. et al., "Enhancing the Robustness of a Multiple Floating Field-Limiting Ring Termination by Introducing a Buffer Layer", IEEE Proceedings of the 2012 24th International Symposium on Power Semiconductor Devices and ICs, Burges, Belgium, Jun. 3-7, 2012, pp. 357-360.

* cited by examiner

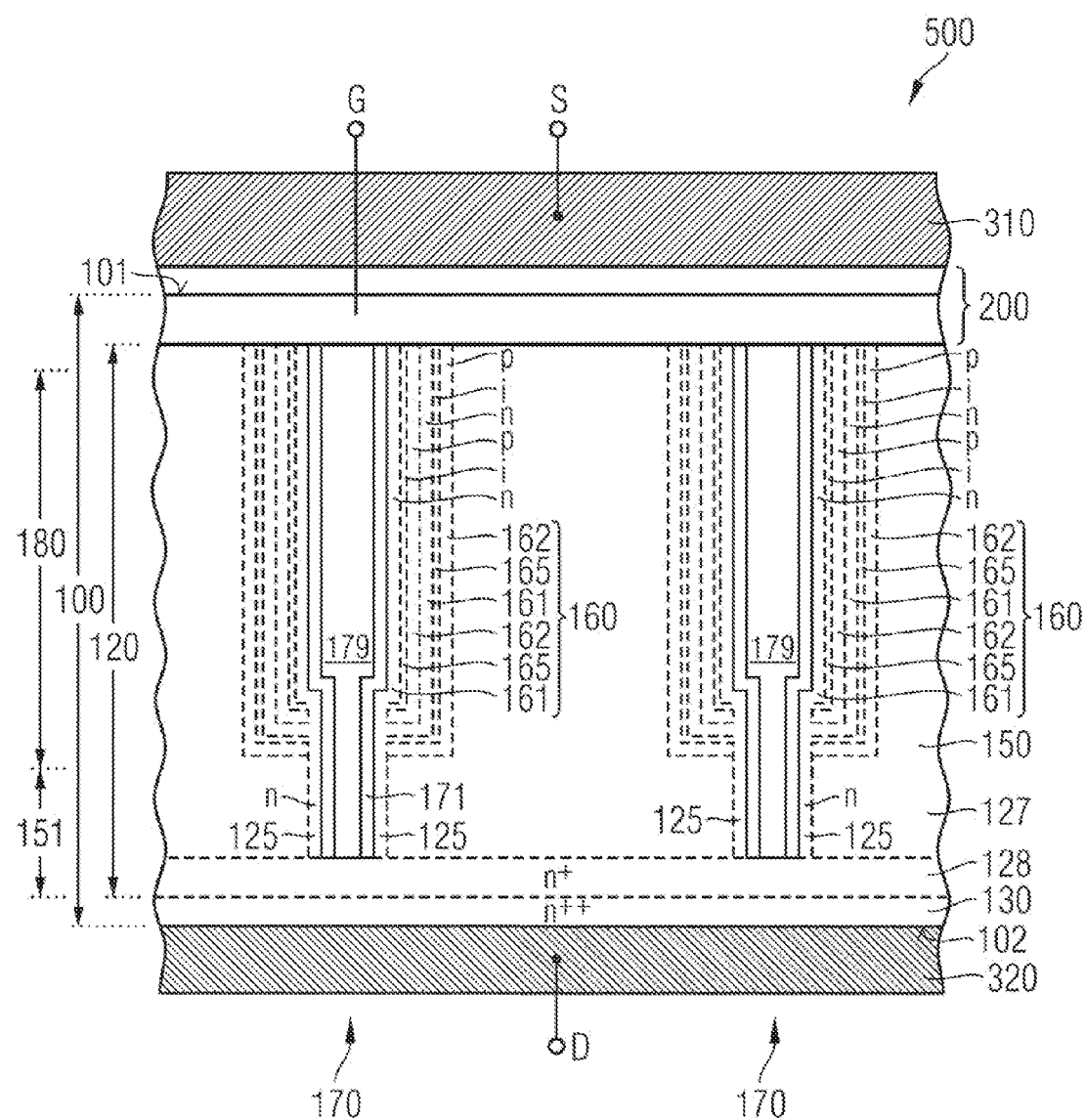

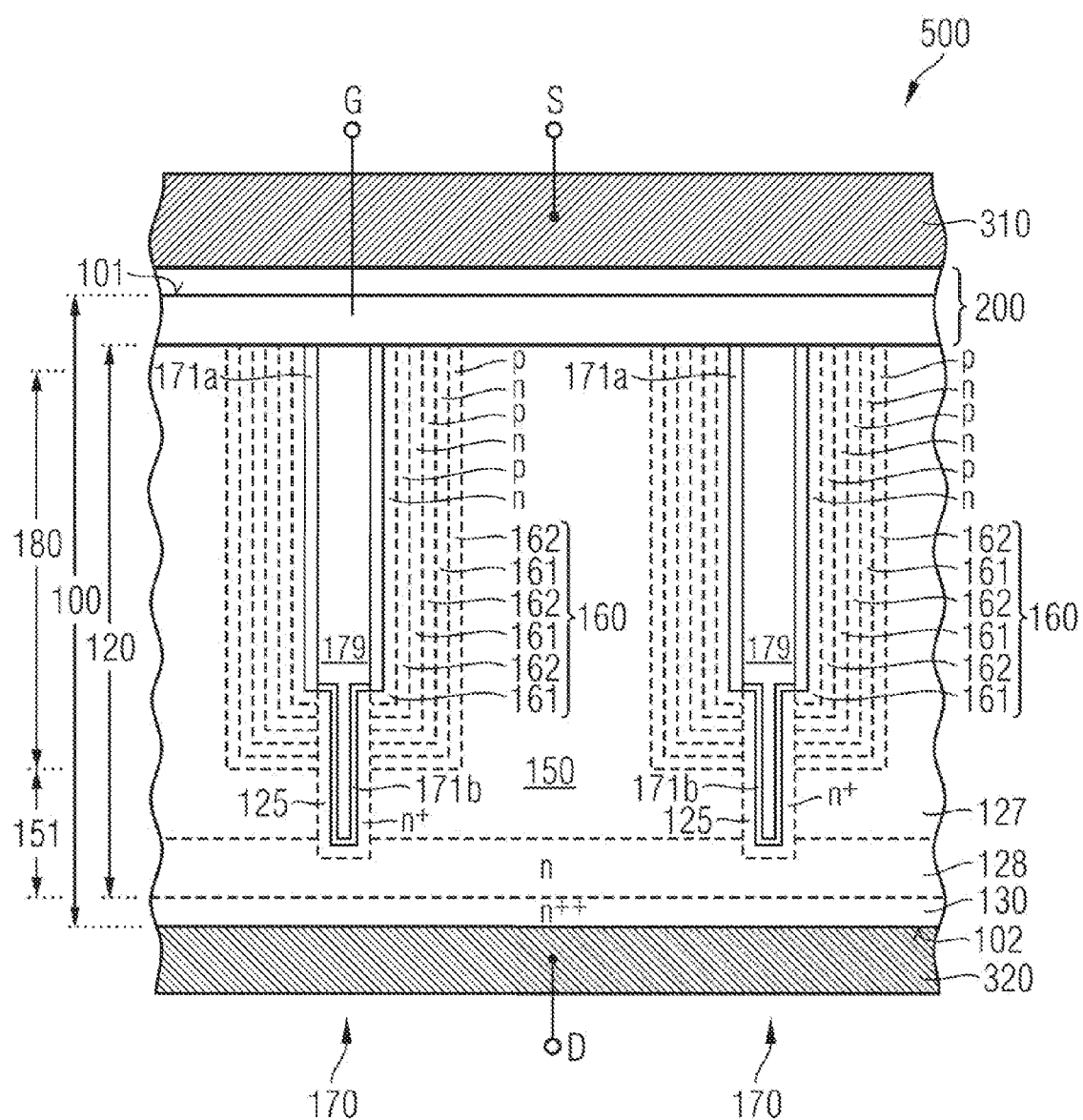

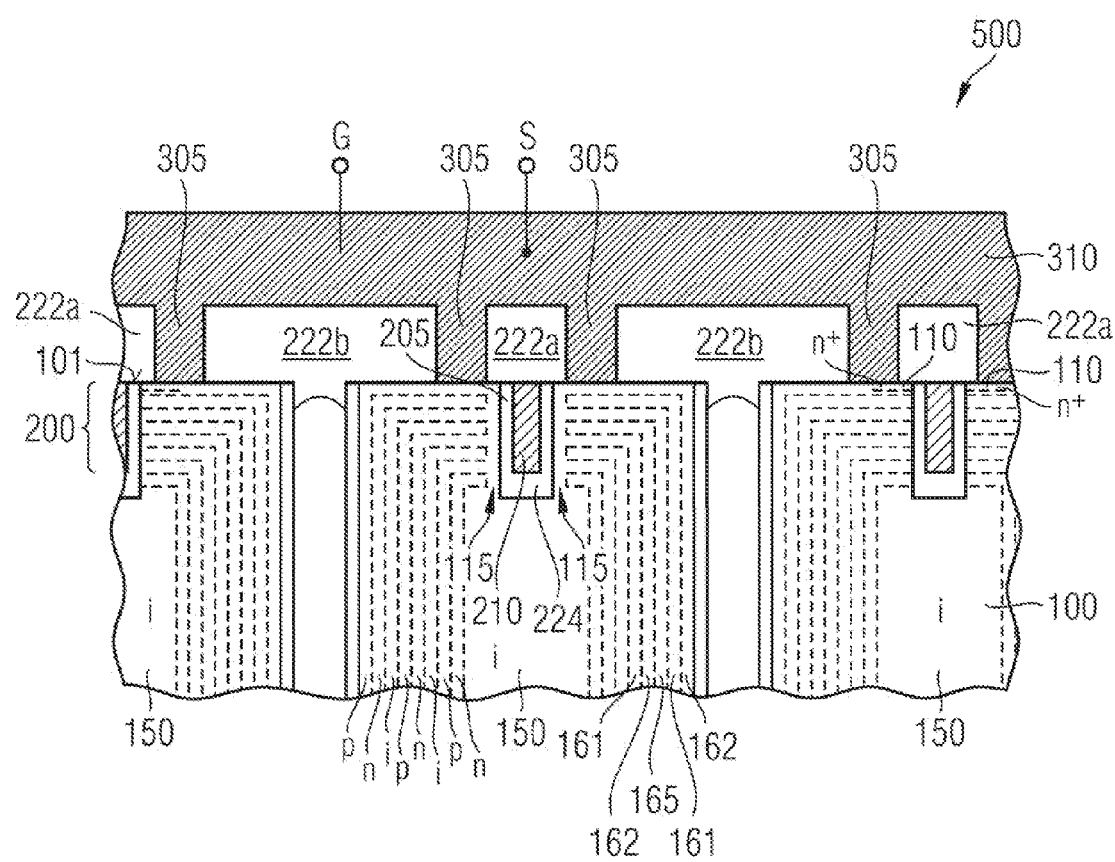

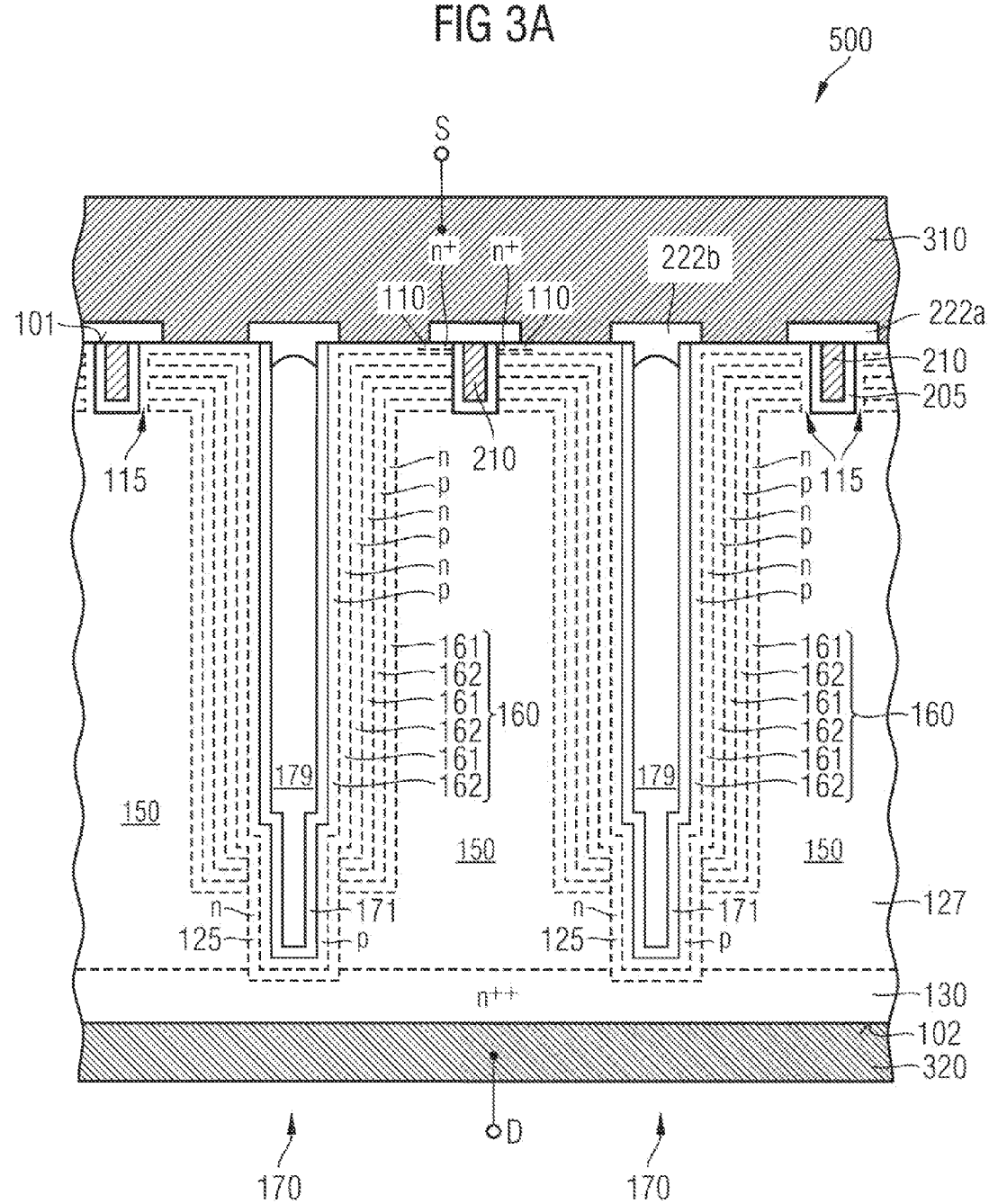

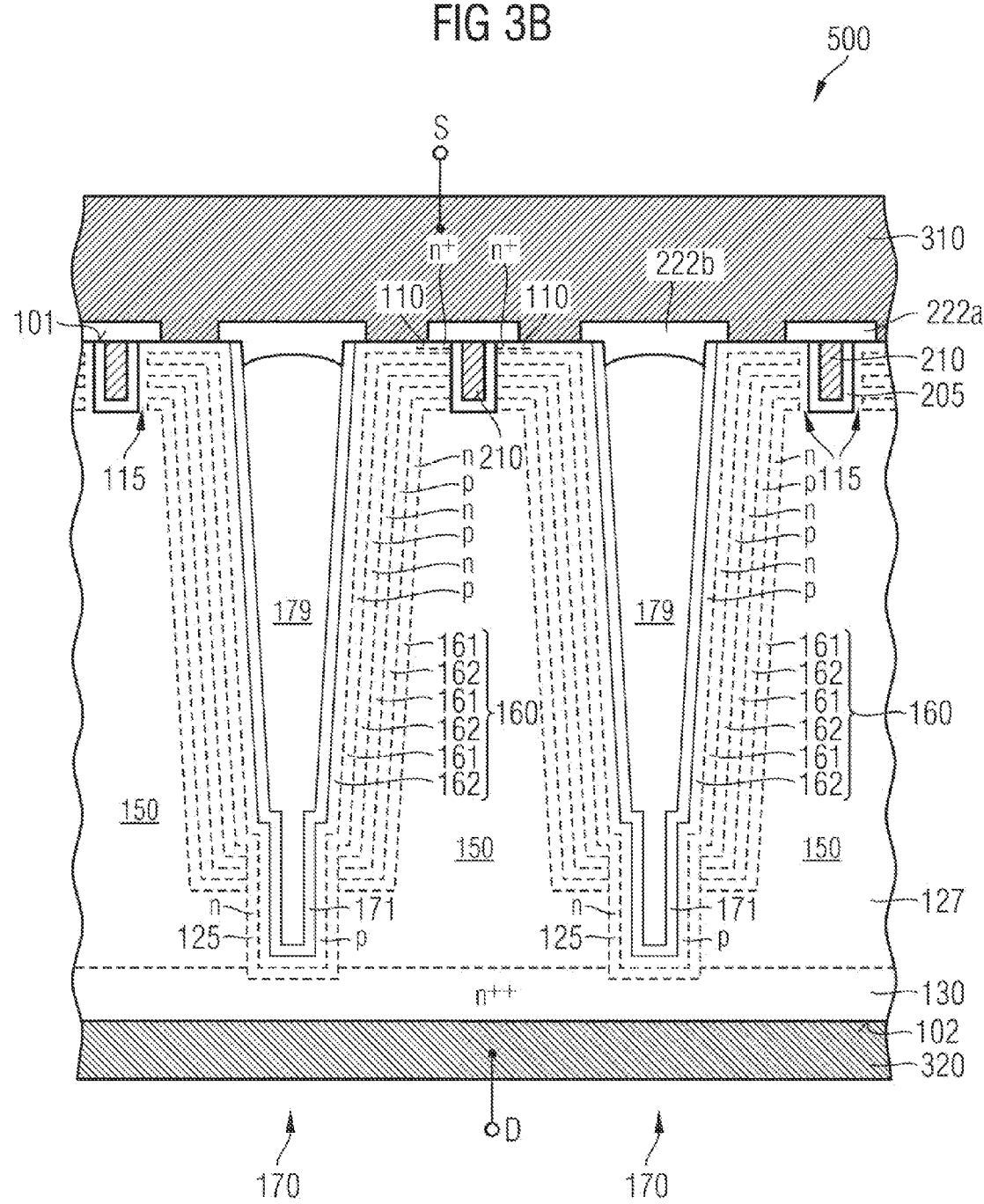

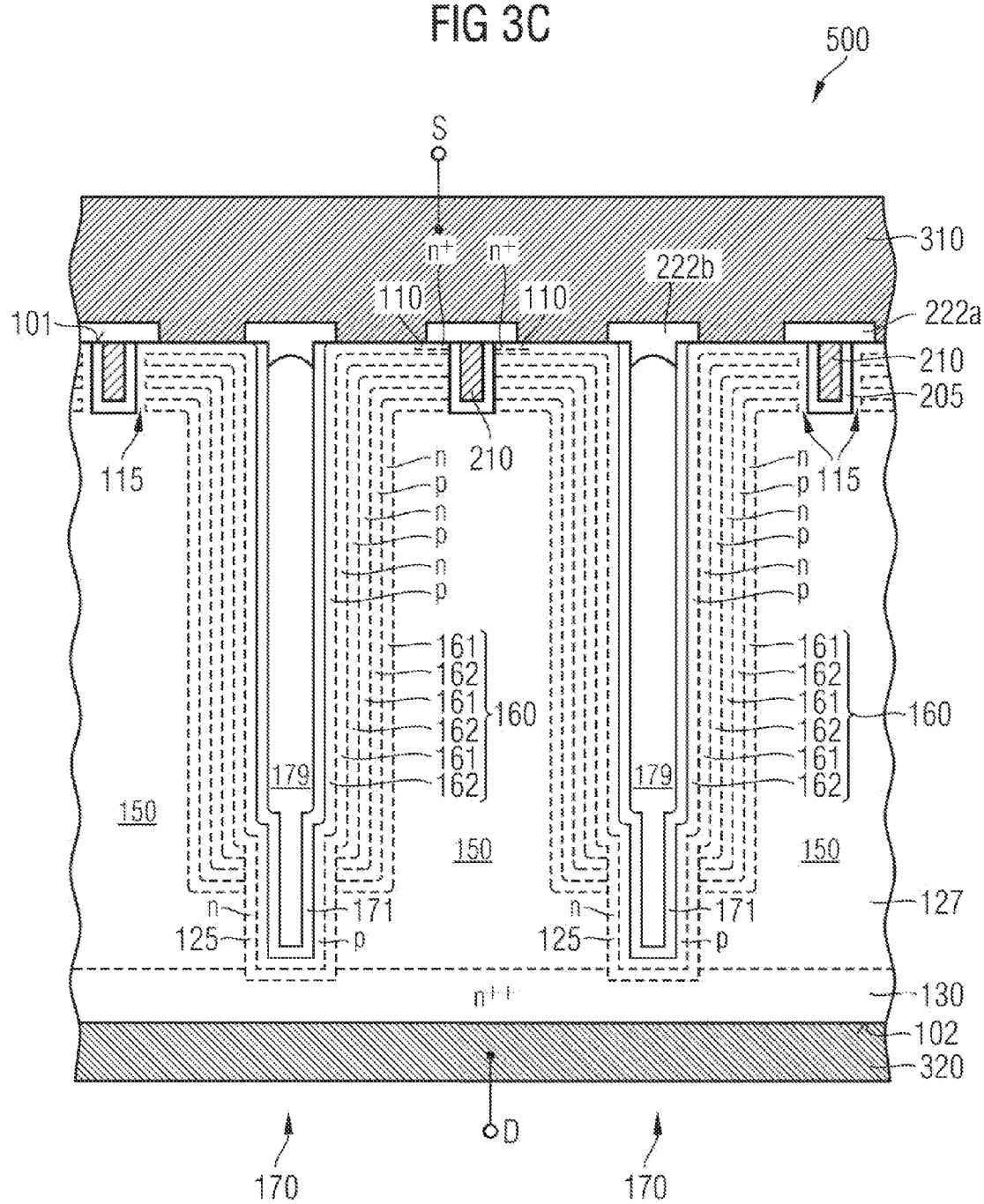

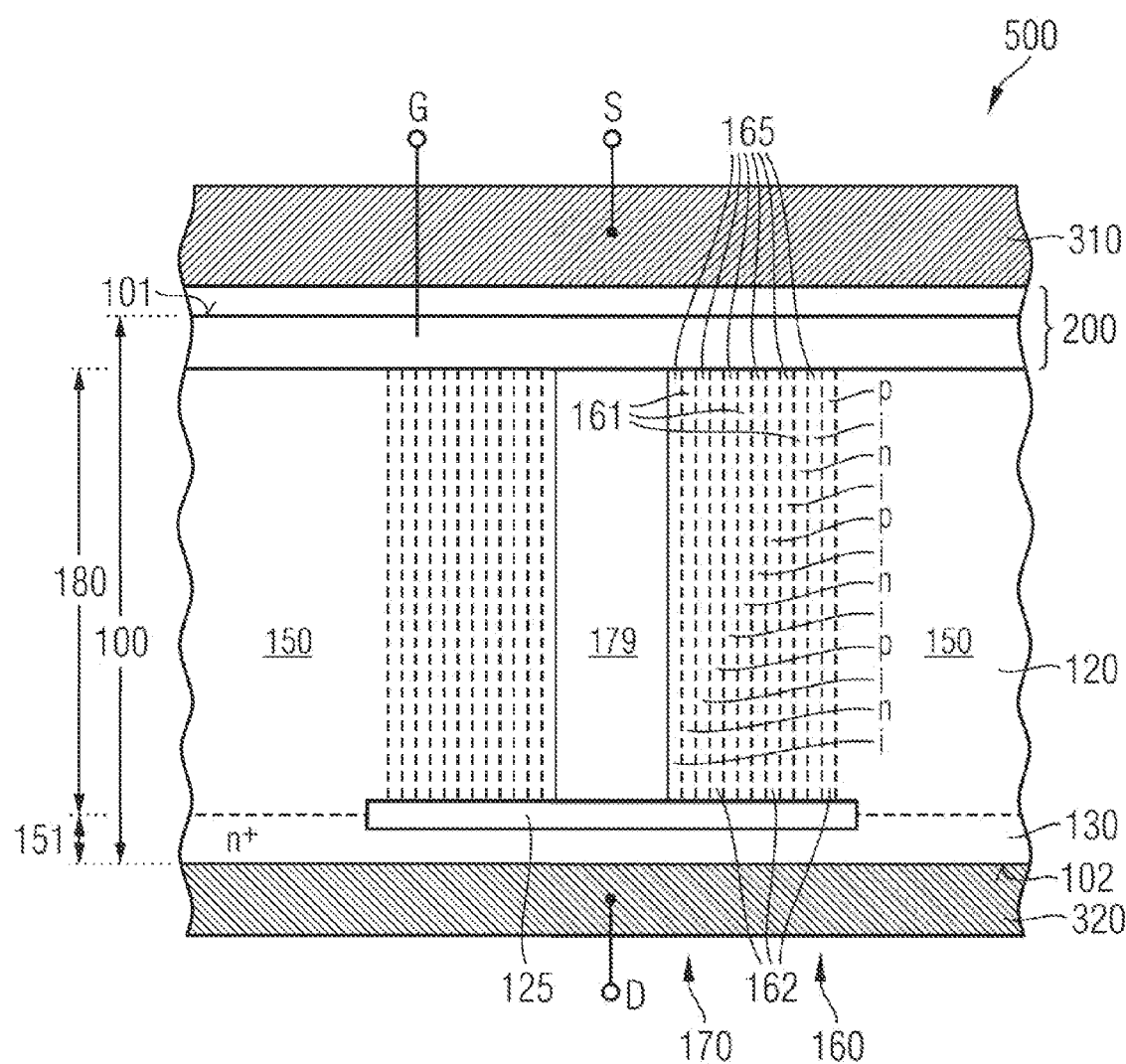

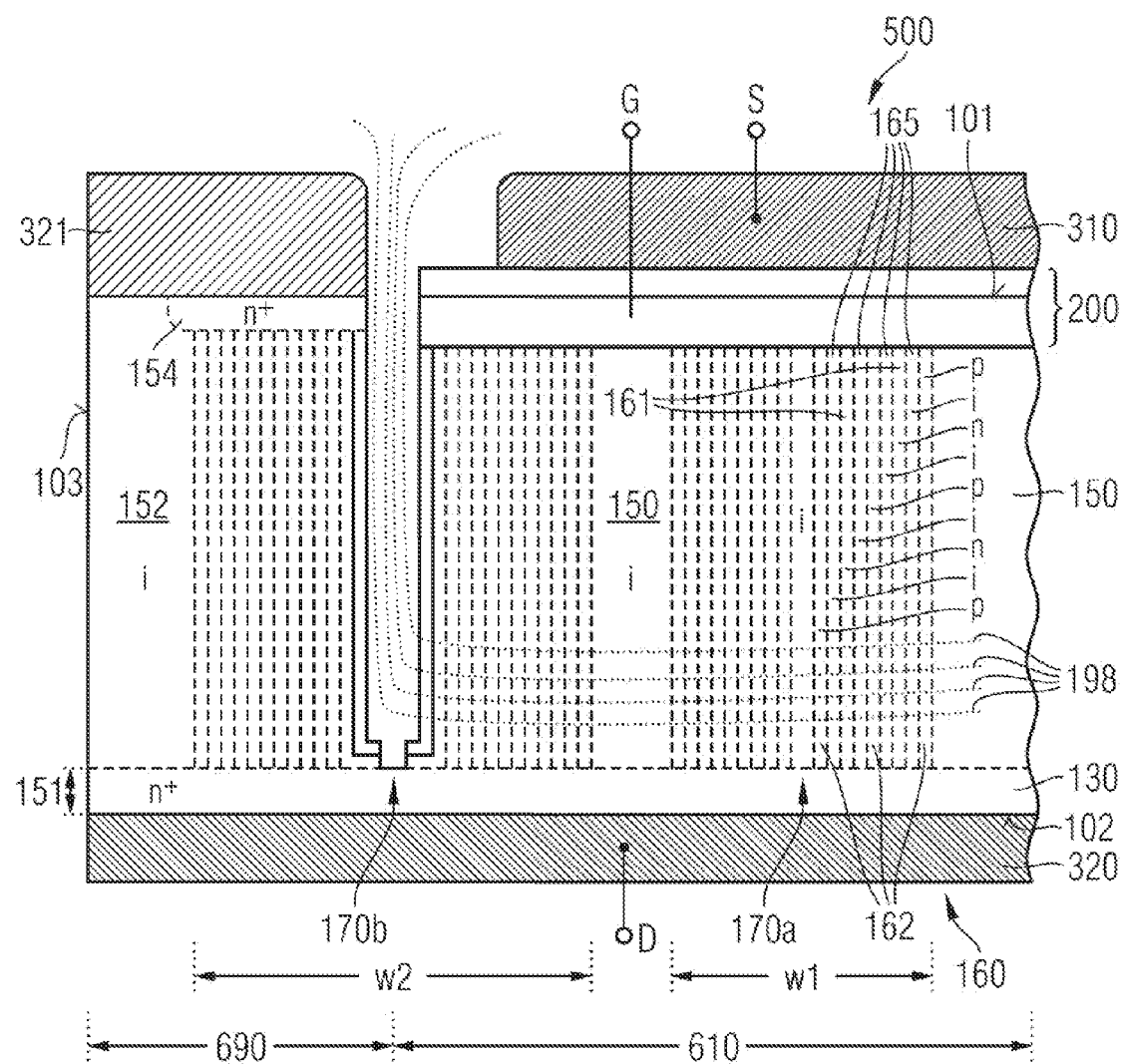

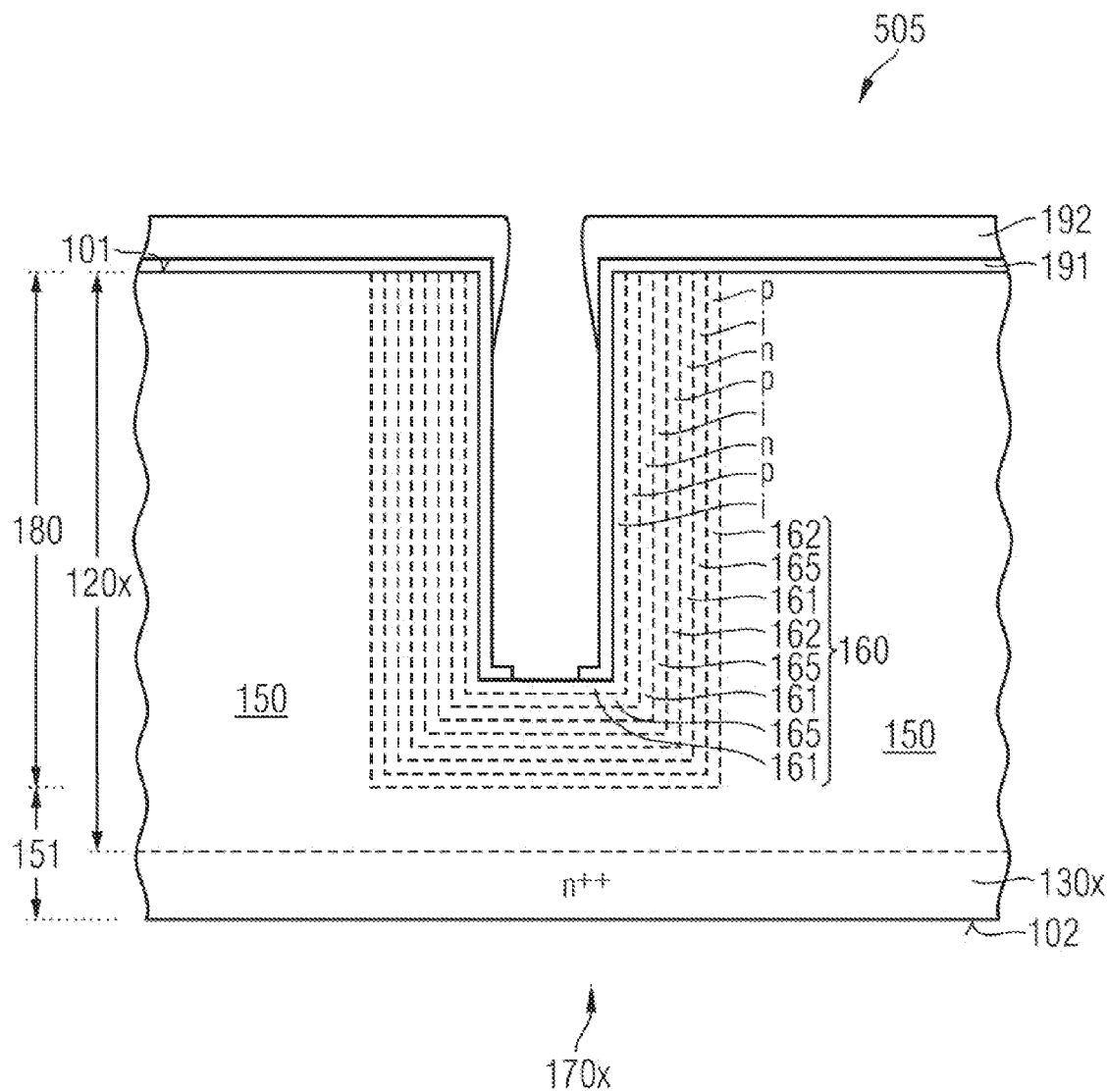

SUPER JUNCTION SEMICONDUCTOR DEVICE HAVING A COMPENSATION STRUCTURE

BACKGROUND

A super junction structure of a super junction device based on a trench concept may include two or more pairs of complementary doped compensation layers extending substantially parallel to a flow direction of an on-state current flowing in a conductive state of the super junction device in one type of the complementary doped layers. In a reverse blocking mode, the complementary doped layer pairs are depleted, resulting in a high reverse breakdown voltage even at a comparatively high impurity concentration in the doped layers carrying the on-state current. It is desirable to manufacture super junction semiconductor devices more economically.

SUMMARY

According to an embodiment, a super junction semiconductor device comprises a semiconductor portion with mesa regions protruding from a base section. The mesa regions are spatially separated in a lateral direction parallel to a first surface of the semiconductor portion. A compensation structure with at least two first compensation layers of a first conductivity type and at least two second compensation layers of a complementary second conductivity type covers sidewalls of the mesa regions and portions of the base section between the mesa regions. Buried lateral faces of segments of the compensation structure cut the first and second compensation layers between the mesa regions. A drain connection structure of the first conductivity type extends along the buried lateral faces and structurally connects the first compensation layers.

According to another embodiment of a super junction semiconductor device, a semiconductor portion comprises mesa regions protruding from a base section. The mesa regions are spatially separated in a lateral direction parallel to a first surface of the semiconductor portion. A compensation structure with at least two first compensation layers of a first conductivity type and at least two second compensation layers of a complementary second conductivity type directly adjoins and covers mesa sidewalls and end faces of the mesa regions. Surficial lateral faces of segments of the compensation structure cut the first and second compensation layers in a vertical projection of the mesa regions. Body zones of the second conductivity type extend along the surficial lateral faces and structurally connect the second compensation layers.

Another embodiment provides a super junction semiconductor device including a semiconductor portion with mesa regions protruding from a base section. The mesa regions are spatially separated in a lateral direction parallel to a first surface of the semiconductor portion. A compensation structure that covers at least sidewalls of the mesa regions contains at least two first compensation layers of a first conductivity type, at least two second compensation layers of a complementary second conductivity type, and at least one interdiffusion layer between one of the first and one of the second compensation layers.

A further embodiment refers to a super junction semiconductor device including a semiconductor portion with a cell area and an edge area surrounding the cell area in lateral directions with respect to a first surface of the semiconductor portion. In the cell area, mesa regions that protrude from a base section are spatially separated in at least one of the lateral directions by a first distance. In the edge area, a termination region protruding from the base section is spatially separated from a neighboring mesa region by a second distance greater than the first distance. A compensation structure with at least one compensation layer of a first conductivity type and at least one compensation layer of a complementary second conductivity type covers at least sidewalls of the mesa and termination regions.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of thus specification. The drawings illustrate the embodiments of the present disclosure and together with the description serve to explain principles of the embodiments. Other embodiments and intended advantages will be readily appreciated as they become better understood by reference to the following detailed description.

FIG. 1A is a schematic cross-sectional view of a portion of a super junction semiconductor device in accordance with an embodiment providing pairs of complementary doped compensation layers and a drain connection structure provided from a section of one of the compensation layers.

FIG. 1B is a schematic cross-sectional view of a portion of a super junction semiconductor device in accordance with an embodiment providing pairs of complementary doped compensation layers and a drain connection structure provided from a dedicated drain connection structure.

FIG. 2C is a schematic cross-sectional view of a control portion of a super junction semiconductor device in accordance with embodiments providing vertical transistor cells with gate electrodes buried in a semiconductor portion and portions of the compensation layers in the vertical projection of mesa regions with vertical sidewalls.

FIG. 3A is a schematic cross-sectional view of a portion of a super junction semiconductor device in accordance with an embodiment providing a drain connection structure, vertical transistor cells with gate electrodes buried in a semiconductor portion and portions of compensation layers in the vertical projection of mesa regions of the semiconductor portion.

FIG. 3B is a schematic cross-sectional view of a portion of a super junction semiconductor device in accordance with an embodiment providing a drain connection structure, vertical transistor cells with gate electrodes buried in a semiconductor portion and portions of compensation layers in the vertical projection of mesa regions with tapering sidewalls.

FIG. 3C is a schematic cross-sectional view of a portion of a super junction semiconductor device in accordance with an embodiment providing a drain connection structure, vertical transistor cells with gate electrodes buried in a semiconductor portion and portions of compensation layers in the vertical projection of mesa regions with rounded edges.

FIG. 4A is a schematic cross-sectional view of a portion of a super junction semiconductor device in accordance with an embodiment providing a compensation structure including interdiffusion layers.

FIG. 5 is a schematic cross-sectional view of a portion of a super junction semiconductor device including an edge area according to an embodiment providing a termination structure.

FIG. 6C shows the semiconductor substrate of FIG. 6B after providing an etch mask using the auxiliary mask.

FIG. 7E shows the semiconductor substrate of FIG. 7D after forming a spacer mask from the mask liner and cutting the correction layer using the spacer mask.

DETAILED DESCRIPTION

Figure 2A:
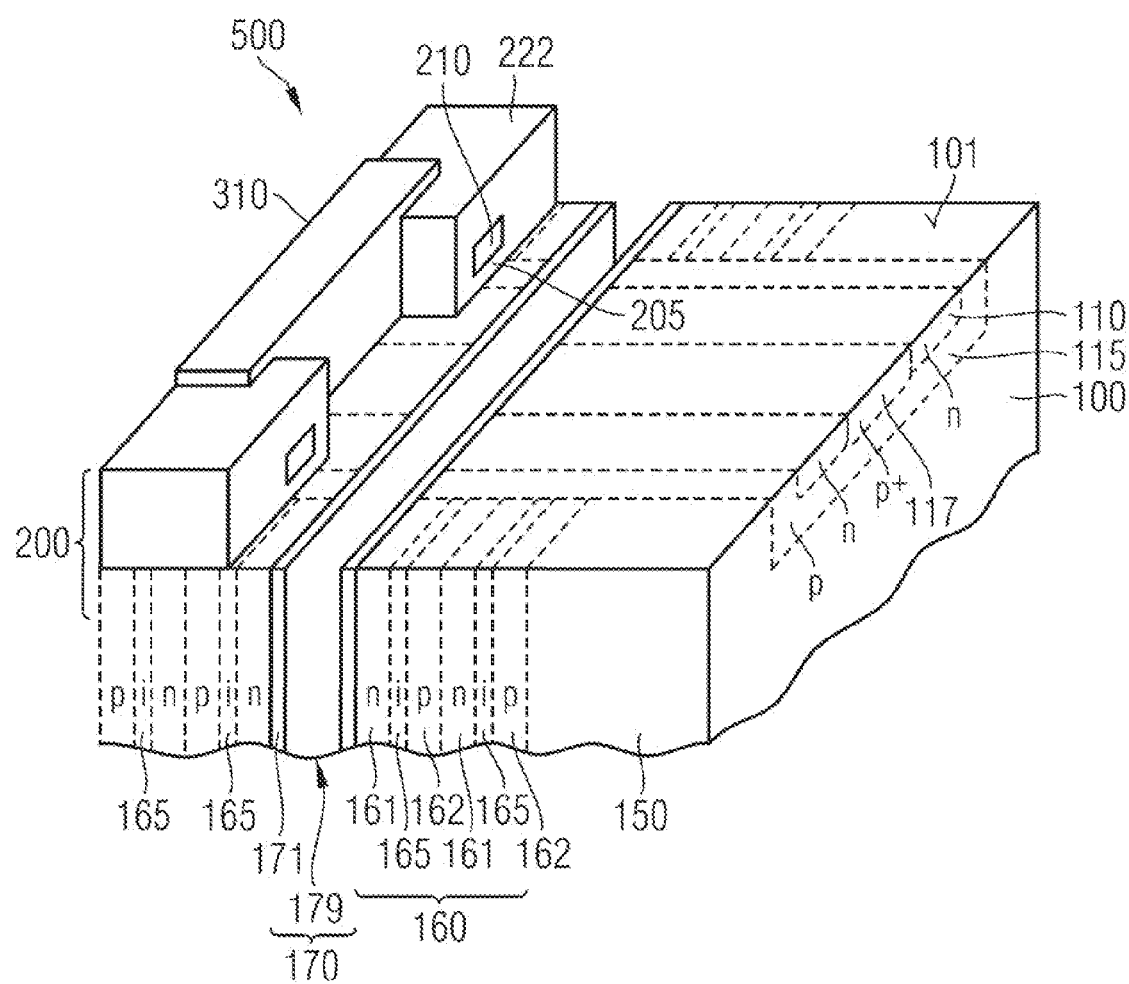
FIG. 2A is a schematic cross-sectional view of a control portion of a super junction semiconductor device in accordance with embodiments providing planar transistor cells with gate electrodes outside a semiconductor portion and without compensation layers in the vertical projection of mesa regions of the semiconductor portion.

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n⁻" means a doping concentration lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations.

FIG. 1A shows a super junction semiconductor device 500 with a semiconductor portion 100 having a first surface 101 and a second surface 102 parallel to the first surface 101. The semiconductor portion 100 is provided from a single-crystalline semiconductor material, for example silicon Si, silicon carbide SiC, germanium Ge, a silicon germanium crystal SiGe, gallium nitride GaN or gallium arsenide GaAs. In case of a semiconductor portion 100 based on silicon Si, a distance between the first and second surfaces 101, 102 is at least 40 μm, for example at least 175 μm. The semiconductor portion 100 may have a rectangular shape with an edge length in the range of several millimeters or a circular shape with a diameter of several millimeters. The normal to the first and second surfaces 101, 102 defines a vertical direction and directions orthogonal to the normal direction are lateral directions.

The semiconductor portion 100 may include an impurity layer 130 of a first conductivity type. The impurity layer 130 may extend along a complete cross-sectional plane of the semiconductor portion 100 parallel to the second surface 102. In case the semiconductor device 500 is an IGFET (insulated gate field effect transistor), the impurity layer 130 directly adjoins the second surface 102 and a mean net impurity concentration in the impurity layer 130 is comparatively high, e.g., at least $5 \times 10^{18}$ cm$^{-3}$. In case the semiconductor device 500 is an IGBT (insulated gate bipolar transistor), a collector layer of a second conductivity type, which is the opposite of the first conductivity type, is arranged between the impurity layer 130 and the second surface 102 and the mean net impurity concentration in the impurity layer 130 may be between $5\times10^{12}$ and $5\times10^{16}$ cm$^{-3}$, by way of example.

The semiconductor portion 100 further includes a drift zone 120 with a super junction structure 180 between the first surface 101 and the impurity layer 130. In the drift zone 120 trench structures 170 extend along the vertical direction with sections of the semiconductor portion 100 between the trench structures 170 forming mesa regions 150. The mesa regions 150 protrude front a continuous base section 151, which includes at least a portion of the impurity layer 130 and which may include a portion of the drift layer 120 directly adjoining the impurity layer 130. The mesa regions 150 may be intrinsic, uniformly p-doped, uniformly n-doped or the impurity concentration may change gradually or in steps from p-loaded to n-loaded or vice-versa. Trench structures 170 spatially separate the mesa regions 150 in at least one lateral direction parallel to the first surface 101.

In the base section 151, the drift zone 120 may include a pedestal layer 128 of the first conductivity type directly adjoining the impurity layer 130. The super junction structure 180 may directly adjoin the pedestal layer 128 or the impurity layer 130. As illustrated, the drift zone 120 may include a continuous portion 127 between the super junction structure 180 and the pedestal layer 128 or between the super junction structure 180 and the impurity layer 130.

To be effective as a field stop, the pedestal layer 128 may have a mean net impurity concentration that is higher than in the continuous portion 127 of the drift zone and lower than in the impurity layer 130. The mean net impurity concentration in the pedestal layer 128 may be at least 10 times the mean net impurity concentration in the continuous portion 127 and at most a tenth of the mean net impurity concentration in the impurity layer 130. For example, the mean net impurity concentration in the pedestal layer 128 that is effective as field stop may be at least $1\times10^{16}$ cm$^{-3}$ and as much as $5\times10^{17}$ cm$^{-3}$.

According to other embodiments, the pedestal layer 128 is effective as a buffer region and has a mean net impurity concentration lower than the mean net impurity concentration in the continuous portion 127. For example, the mean net impurity concentration in the continuous portion 127 is at least twice the mean net impurity concentration in a pedestal layer 128 that is effective as buffer region.

The super junction structure 180 is based on a layered compensation structure 160, which includes at least two first compensation layers 161 of the first conductivity type and at least two second compensation layers 162 of the second conductivity type, wherein the compensation layers 161, 162 are grouped in pairs of one first 161 and one second compensation layer 162. The number of layer pairs may be between 5 and 10, for example, to achieve a significant reduction of the on state resistance at comparatively low costs.

The compensation layers 161, 162 are at least approximately conformal layers, each layer having an approximately uniform thickness. The compensation layers 161, 162 may be single crystalline semiconductor layers grown by epitaxy, with the crystal lattice growing in registry with a crystal lattice of the single crystalline semiconductor material of the semiconductor portion 100. According to other embodiments, the compensation layers 161, 162 may be formed by re-crystallization of deposited semiconductor material, for example polycrystalline silicon, using a locally effective heating treatment.

The first and second compensation layers 161, 162 may be in-situ doped during epitaxial growth. According to other embodiments, impurities of the first and second conductivity type may be introduced into intrinsic layers, e.g., by using tilted implants or by ALD (atomic layer deposition) depositing mono molecular layers containing the impurities and then annealing the deposited layers. The first and second compensation layers 161, 162 are in substance charge balanced and the lateral area densities deviate from each other by at most 10%. The first compensation layers 161 having the same conductivity type as the impurity layer 130 carry the on-state or forward current in the conductive state. Both the first and the second compensation layers 161, 162 are depleted in the reverse blocking state.

The compensation structure 160 may include further first and second compensation layers and/or interdiffusion layers 165 for example between each pair of first and second compensation layers 161, 162 or between the first and second compensation layers 161, 162 of each layer pair or between all compensation layers 161, 162 such that each second layer in the compensation structure 160 is an interdiffusion layer 165.

The interdiffusion layers 165 are provided from intrinsic single crystalline layers. In the finalized semiconductor device 500 the interdiffusion layers 165 contain impurities of the adjoining compensation layers 161, 162, wherein the concentration of impurities of the first conductivity type decreases with increasing distance to an interface with an adjoining first compensation layer 161 and the concentration of impurities of the second conductivity type decreases with increasing distance to an interface with an adjoining second compensation layer 162.

The interfaces between the layers 161, 162, 165 of the compensation structure 160 are parallel or approximately parallel to an interface between the compensation structure 160 and the material of the semiconductor portion 100.

The compensation structure 160 lines both straight portions of mesa sidewalls of the mesa regions 150 perpendicular or tilted to the first surface 101 and bottom portions of the trench structures 170 between the mesa regions 150, wherein the bottom portions may be curved or approximately planar.

The trench structures 170 may be parallel stripes arranged at regular distances. According to other embodiments, the cross-sectional areas of the trench structures 170 parallel to the first surface 101 may be circles, ellipsoids, ovals, or rectangles, e.g. squares, with or without rounded corners, and the mesa, regions 150 between the trench structures 170 may be stripes or segments of a grid embedding the trench structures 170. Accordingly, the cross-sectional areas of the mesa regions 150 parallel to the first surface 101 may be circles, ellipsoids, ovals or rectangles, e.g. squares, with or without rounded corners and the trench structures 170 are segments of a grid embedding the mesa regions 150.

The thickness of the first compensation layers 161 may be at least 50 nm and at most 500 nm, by way of example, wherein the compensation layers 161, 162 of each pair may have the same thickness or may have different thicknesses. In a vertical section unit the total amount of impurities in the first compensation layer 161 may in substance correspond to the total amount of impurities in the second compensation layer 162 of the same layer pair. According to an embodiment, both the first and second compensation layers 161, 162 have a thickness of about 500 nm and a mean net impurity concentration of about $2.3 \times 10^{16}$ cm$^{-3}$. According to another embodiment, both layers 161, 162 of each layer pair may have a thickness of about 250 nm and the same mean net impurity concentration (doping level) of about $4.5 \times 10^{16}$ cm$^{-3}$.

The interdiffusion layers 165 may have the same thickness as the compensation layers 161, 162 or may be thinner than the compensation layers 161, 162, for example, about half as thick as the compensation layers 161, 162. For example, the compensation layers 161, 162 may have a thickness of about 500 nm and the interdiffusion layers 165 may have a thickness of about 250 nm at a lateral width of the mesa regions 150 of about 2 µm.

The semiconductor device 500 further includes a control structure 200 suitable for the respective type of the semiconductor device 500. In case the semiconductor device 500 is a semiconductor diode, the control structure 200 contains an electrode layer of the second conductivity type electrically connected to the second compensation layers 162. For example, the second conductivity type is the p-type and the electrode layer is a p-type anode layer connected with the p-type compensation layers 162.

In case the semiconductor device 500 is an IGFET or an IBGT, the control structure 200 includes field effect transistor structures for controlling a current flow through the semiconductor portion 100 between the first surface 101 and the second surface 102 in response to a signal applied to a gate terminal G. The control structure 200 includes conductive structures, insulating structures and doped regions formed or buried in the semiconductor portion 100 and may include conductive and insulating structures outside the semiconductor portion 100 as well.

A first electrode structure 310 may be electrically connected to the control structure 200 at the side of the first surface 101. The first electrode structure 310 may be electrically coupled to a source terminal S in case the semiconductor device 500 is an IGFET, to an emitter terminal in case the semiconductor device 500 is an IGBT or to an anode terminal in case the semiconductor device 500 is a semiconductor diode.

A second electrode structure 320 directly adjoins the second surface 102 of the semiconductor portion 100. According to embodiments related to semiconductor diodes or IGFETs, the second electrode structure 320 directly adjoins the impurity layer 130. According to embodiments related to IGBTs, a collector layer of the second conductivity type is provided between the impurity layer 130 and the second electrode structure 320. In case the semiconductor device 500 is an IGFET, the second electrode structure 320 may be electrically coupled to a drain terminal D. In case the semiconductor device 500 is an IGBT, the second electrode structure 320 may be electrically coupled to a collector terminal. In case the semiconductor device 500 is a semiconductor diode, the second electrode structure 320 may be electrically coupled to a cathode terminal.

Each of the first and second electrode structures 310, 320 may consist of or contain, as main constituent(s), aluminum Al, copper Cu, or alloys of aluminum or copper, for example AlSi, AlCu or AlSiCu. According to other embodiments, one or both of the first and second electrode structures 310, 320 may contain one or more layers with nickel Ni, titanium Ti, silver Ag, gold Au, platinum Pt and/or palladium Pd as main constituent(s). For example, at least one of the first and second electrode structures 310, 320 includes two or more sub-layers, at least one of the sub-layers containing one or more of Ni, Ti, W, Ag, Au, Pt, and Pd as main constituent(s), e.g. a silicide, a nitride and/or an alloy.

The compensation structure 160 has buried lateral faces cutting the first and second compensation layers 161, 162 between the mesa regions 150. The buried lateral faces extend in a direction tilted to the first surface 101. The lateral faces of segments of the compensation structure 160 of the same trench structure 170 face each other and may taper with increasing distance to the first surface 101. According to other embodiments, the buried lateral faces are approximately vertical to the first surface 101.

The super junction semiconductor device 500 further includes drain connection structures 125, wherein each drain connection structure 125 extends along the buried lateral face of a segment of the compensation structure 160. The drain connection structure 125 connects the first compensation layers 161 of the compensation structure 160. In addition, the drain connection structure 125 may structurally and electrically connect the first compensation layers 161 with the pedestal layer 128 or the impurity layer 130.

The drain connection structures 125 provide low-resistance current paths between the first compensation layers 161 and the pedestal layer 128 and/or the impurity layer 130. The drain connection structures 125 save a laborious and time-consuming removal of horizontal portions of the compensation structure 160 from the bottom portion between the mesa regions 150. Other than approaches connecting the first compensation layers 161 by out-diffusion of impurities implanted into the trench bottom or into portions of the compensation structure 160 covering the trench bottom, the formation of the drain connection structure 125 gets by with a lower temperature budget and the on state or forward resistance is less prone to deviations resulting from fluctuations of an applied temperature budget.

The drain, connection structures 125 may be a connection layer, wherein the connection layer and an outermost one of the first compensation layers 161 oriented away from the closest mesa region 150 may have the same thickness and the same impurity distribution. The outermost first compensation layer 161 and the connection layer can be two different sections of a single process layer.

A dielectric layer 171 may cover the compensation structure 160 and the drain connection structure 125. The dielectric layer 171 may consist of one single layer or may include two or more sub-layers provided from silicon, oxide, silicon nitride, siliconoxynitride, an organic dielectric, for example polyimide, or a silicate glass, for example BSG (boron silicate glass), PSG (phosphorus silicate glass), or BPSG (boron phosphorus silicate glass). The dielectric layer 171 and the compensation structure 160 may fill the trench structures 170 completely. According to other embodiments, the dielectric layer 171 lines the trench structure 170 on a surface of the compensation structure 160 and the drain connection structure 125. A residual space in the trench structure 170 may form a void 179 (air gap, i.e., a void filled, with a gas) in the finalized device. Other than a complete trench fill, which may induce mechanical strain into the surrounding semiconductor material, the void 179 accommodates mechanical strain. According to other embodiments, a fill material, e.g. an intrinsic semiconductor material that may be single crystalline, amorphous or polycrystalline, may fill the residual space of the trench structure 170.

According to an embodiment, the dielectric layer 171 is a semiconductor oxide grown on the compensation structure 160 and the drain connection structure 125, e.g., a native oxide, or a combination of a grown oxide and a highly non-conformal dielectric layer predominantly deposited in a portion of the trench structure 170 oriented to the first surface 101, bridging the residual space between the two opposing compensation structures 160 close to the first surface 101, and thereby closing the void 179 in the trench structure 170.

The semiconductor device 500 of FIG. 1B differs from the semiconductor device 500 of FIG. 1A in the number of layer pairs included in the compensation structure 160, in the absence of interdiffusion layers 165, and in that the drain connection structure 125 is formed from another layer than the outermost first compensation layer 161. Since the drain connection structure 125 does not have to be depleted in the reverse blocking mode, and since the drain connection structure 125 results from another process layer than the compensation layers 161, 162, the impurity concentration in the drain connection structure 125 can exceed the impurity concentration in the first compensation layers 161 by at least 10 times such that a lower on-state resistance can be achieved.

The dielectric layer 171 may include a first portion 171a covering the compensation structure 160 and a second portion 171b covering the drain connection structure 125. The first and the second portions 171a, 171b may result from differently processed layers. For example, the first portion 171a may be provided before exposing the buried lateral faces of the compensation structure 160.

Figure 2B:
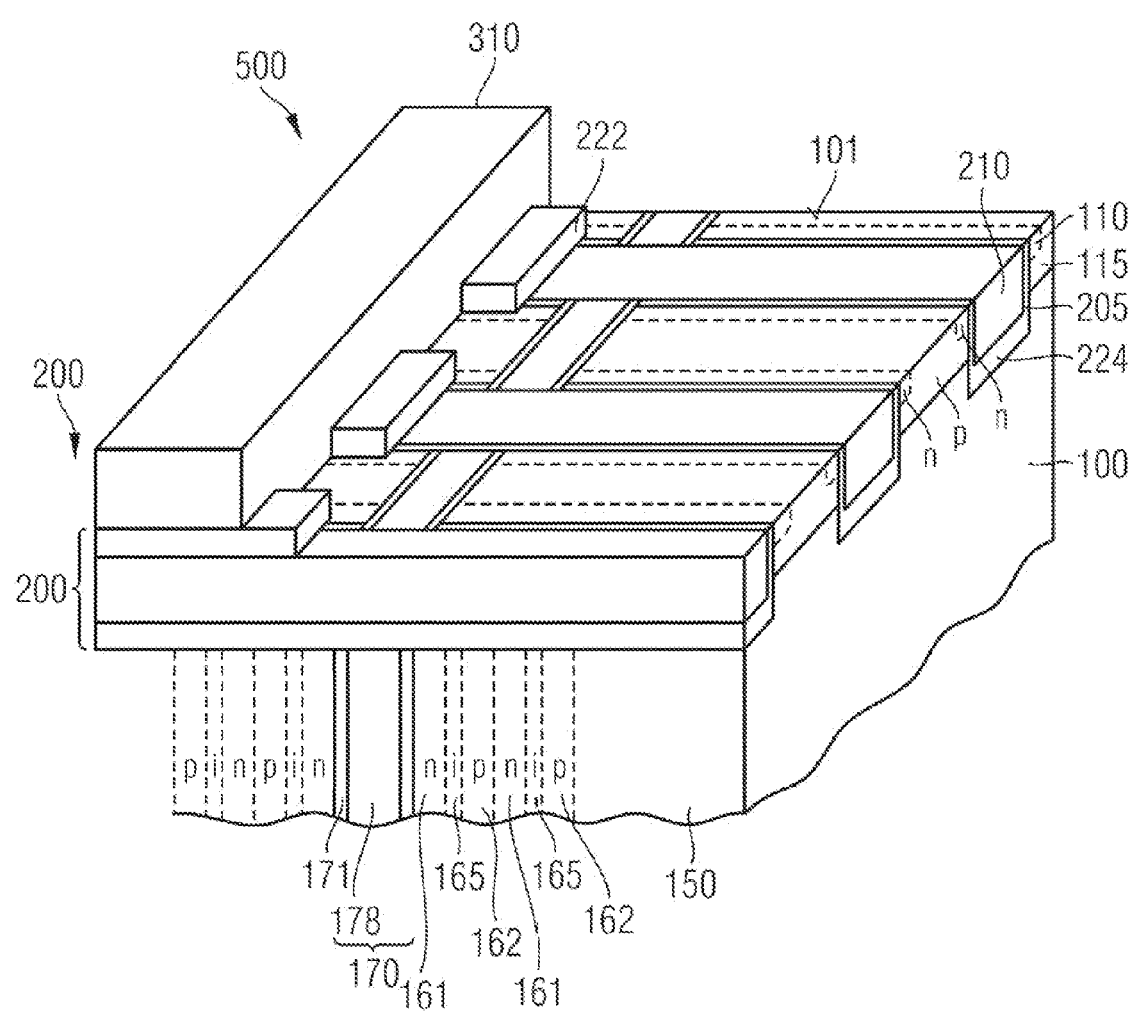
FIG. 2B is a schematic cross-sectional view of a control portion of a super junction semiconductor device in accordance with embodiments providing vertical transistor cells with gate electrodes buried in a semiconductor portion and without compensation layers in the vertical projection of mesa regions of the semiconductor portion.

FIGS. 2A to 2C illustrate embodiments of the control structure 200 for IGFETs and IGBTs. The illustrated control structures 200 are based on IGFET cells with the first compensation layer 161 of the compensation structure 160 forming part of the drain structure of the respective IGFET cell.

FIG. 2A shows a control structure 200 including planar FET cells with gate electrodes 210 provided outside the semiconductor portion 100. The semiconductor portion 100 includes body zones 115 of the second conductivity type extending from the first surface 101 or a contact trench into the semiconductor portion 100. The body zones 115 are formed as wells in upper portions of the mesa regions 150 and in portions of the layers from which the compensation structure 160 is formed. The body zones 115 may be stripes crossing the mesa regions 150 between neighboring trench structures 170.

The body zones 115 may have a mean net impurity concentration of at least $1 \times 10^{16}$ cm$^{-3}$ and at most $1 \times 10^{18}$ cm$^{-3}$. Each body zone 115 may be structurally connected to the second compensation layers 162 of the compensation structure 160. In each body zone 115, one or two source zones 110 of the first conductivity type are formed as wells embedded in the body zones 115 and extend from the first surface 101 or a contact trench into the body zones 115. Heavily doped contact zones 117 may extend between neighboring source zones 110 into the body zones 115 for providing a low-ohmic contact between the first electrode structure 310 and the body zones 115. Gate electrodes 210 run outside the semiconductor portion 100 parallel to portions of the body zones 115 directly adjoining the first surface 101. A first dielectric structure 222 dielectrically insulates the gate electrodes 210 from the first electrode structure 310. A gate dielectric 205 is formed along the first surface 101 and capacitively couples the gate electrodes 210 with channel portions in the body zones 115 along the gate dielectrics 205 such that a potential applied to the gate electrodes 210 controls the charge carrier distribution in the channel portions.

The control structure 200 of FIG. 2B is based on buried gate electrodes 210 running in gate trenches extending in a lateral direction perpendicular to the trench structures 170 between neighboring body zones 115. The gate trenches cross the mesa regions 150 and the trench structures 170, which may include a filling material 178 filling a residual space in the trench structures 170. The body zones 115 structurally connect the second compensation layers 162 such that a reverse blocking voltage applied between the first electrode structure 310 and a second electrode structure at an opposite side of the semiconductor portion 100 is effective for all compensation layers 161, 162.

A first dielectric structure 222 dielectrically insulates the gate electrode 210 from the first electrode structure 310 and a second dielectric structure 224 dielectrically insulates the gate electrode 210 from the mesa regions 150. The first electrode structure 310 is electrically connected to the source zones 110 and to the contact zones 117 through openings in the first dielectric structure 222.

A gate dielectric 205 is formed along the sidewalls of the gate trenches tilted to the first surface 101 and capacitively couples the gate electrodes 210 with channel portions in the body zones 115 along the gate dielectrics 205 such that a potential applied to the gate electrodes 210 controls the charge carrier distribution in the channel portions. In the conductive state a suitable potential applied to the gate electrodes 210 induces formation of a conductive channel of charge carriers in the channel portions. The conductive channel connects the source sores 110 with the first compensation layers 161.

FIG. 2C shows a control structure 200 in case the compensation structure 160 includes portions in the vertical projection of the mesa regions 150 where surficial lateral faces of segments of the compensation structure 160 cut the first and second compensation layers 161, 162 and the surficial lateral faces in the vertical projection of the mesa regions 150 expose end faces of the compensation layers 161, 162. Body zones 115 of the second conductivity type extend along sections of the surficial lateral faces and structurally and electrically connect the second compensation layers 162 with each other such that the complete compensation structure 160 can be depleted when a reverse blocking voltage is applied to the semiconductor device 500. The body zones 115 may have a mean net impurity concentration of at least $1 \times 10^{16}$ cm$^{-3}$ and at most $1 \times 10^{18}$ cm$^{-3}$.

Gate electrodes 210 provided in gate trenches extending from a surface of the portions of the compensation structure 160 covering end faces of the mesa regions 150 into the compensation structure 160. Gate dielectrics 205 dielectrically separate the gate electrodes 210 from the respective body zones 115. Outside the sections of the surficial lateral faces where the body zones 115 are provided, the first and second compensation layers 161, 162 directly adjoin the gate dielectric 205.

First portions 222a of a first dielectric structure dielectrically insulate the gate electrodes 210 from a first electrode structure 310. Second portions 222b of the first dielectric structure close the trench structures 170 and may seal a void remaining in the trench structures 170. A second dielectric structure 224 dielectrically insulates the gate electrode 210 from the mesa regions 150.

Source zones 110 of the first conductivity type extend from the surface of the compensation structure 160 into the compensation structure 160 in the vertical projection of at least portions of at least some of the mesa regions 150, wherein the source zones 110 directly adjoin the gate dielectrics 205.

According to an embodiment, the outermost layer of the compensation structure 160 forming the surface of the compensation structure 160 in the vertical projection of the end faces of the mesa regions 150 is a layer of the second conductivity type and the source zones 110 extend up to a distance smaller than the thickness of the outermost compensation layer 162. The source zones 110 may be provided along each of the gate electrodes 210 and for each side. According to other embodiments, the source zones 110 are provided only at one of the two sides of the gate electrodes 210. Some of the gate electrodes 210, for example each second one, may be provided without source cone 110. According to other embodiments the source zones 110 are provided only in sections of a lateral extension of the gate electrodes perpendicular to the cross-sectional plane.

Contact structures 305, for example contact plugs or contact stripes, extend between the first electrode structure 310 and the surface of the compensation structure 106 through openings between the first and second portions 222a, 222b of the first dielectric structure and electrically connect the first electrode structures 310 with both the source zones 110 of the first conductivity type and the outermost compensation layer 162 of the second conductivity type.

Compared to the approaches in FIGS. 2A and 2B, providing the control structure 200 of FIG. 2C does not include expensive and time consuming process steps for barring the compensation layers 161, 162 from growing on the end faces of the mesa regions 150 or for removing previously grown portions of the compensation layers 161, 162 from the end faces of the mesa regions 150. As a consequence, the semiconductor device 500 can be manufactured at lower production costs.

Instead, the control structure 200 of FIG. 2C allows the compensation structure 160 to grow by epitaxy also on the end faces of the mesa regions 150, wherein the outermost compensation layer may be a layer of the second conductivity type, which is opposite to the conductivity type of the first compensation layers 161 carrying the on-state or forward current in the conductive state.

Gate trenches are etched through the compensation structure 160 in the vertical projection of the mesa regions 150. The gate trench etch exposes surficial lateral faces of segments of the compensation structures 160 which cut the first and second compensation layer 161, 162. Along sections of the sidewalls of the gate trenches exposing the end portions of the first and second compensation layers, body zones 115 are provided.

According to an embodiment, the body zones 115 are provided by locally growing a layer of the second conductivity type selectively along first sections of the surficial lateral faces of the compensation structure 160 by using a hard mask covering other portions of the compensation structure 160 and second sections of the surficial lateral faces and leaving the first sections of the surficial lateral faces exposed. According to another embodiment, p-type impurities may be introduced into the first sections of the lateral faces, for example by a masked diffusion or tilted implant process through exposed sections of the sidewalls of the gate trenches. The introduced impurities of the second conductivity type locally overcompensate the exposed end portions of the first compensation layers 161 such that continuous body zones 115 extend between the surface of the compensation structure 160 and each of the second compensation layers 162. The overcompensation of the respective first compensation layer 161 may be performed for each first compensation layer in another section along a lateral direction perpendicular to the cross-sectional plane.

In addition, impurities of the first conductivity type may be locally implanted through the sidewalls of the gate trenches in order to adjust the impurity concentration in the channel portions of the body zone 115, for example for reducing the net impurity concentration in the heavily doped end portions of the second compensation layers 162.

The control structure 200 of FIG. 2C can be combined with other approaches for electrically connecting the first compensation layers 161 at the drain side. According to an embodiment, the compensation structure 160 is provided in a way that portions of second compensation layers 162 and interdiffusion layers 165 growing on the base section 151 between the mesa regions 250 are removed before the next first compensation layer 161 is deposited such that at the bottom of the trench structures 170 a resulting layer stack exclusively includes portions of one, some or all of the first compensation layers 161 and electrically connects the first compensation layers 161 with each other and with the impurity layer 130.

According to another embodiment, impurities of the first conductivity type are introduced, e.g. implanted, into the bottom of the trench structure, wherein the impurities locally overcompensate the impurities in the second compensation layers 162. For example, the impurities may be implanted after the formation of any of the second compensation layers 162 and any of the interdiffusion layers 165.

FIG. 3A combines the approaches for connecting the second compensation layers 162 on the source side as described with reference to FIG. 2C and the first compensation layers 161 at the drain side as described with reference to FIGS. 1A and 1B, wherein the compensation structure 160 contains no interdiffusion layers 165 and three pairs of first and second compensation layers 161, 162.

The embodiment of FIG. 3B differs from the embodiment of FIG. 3A in that the sidewalls of lightly doped mesa regions 150 taper with increasing distance to the second surface 102, allowing a graded change of the degree of compensation in the super junction structure 180 along the vertical direction, for example from lightly p-loaded in a section oriented to the first surface 101 to lightly n-loaded in a section oriented to the second surface 102.

The semiconductor device 500 of FIG. 3C differs from the embodiment shown in FIG. 3A in rounded edges of the mesa regions 150 and the compensation structure 160 for avoiding local peaks of the electric field strength.

Figure 4B:
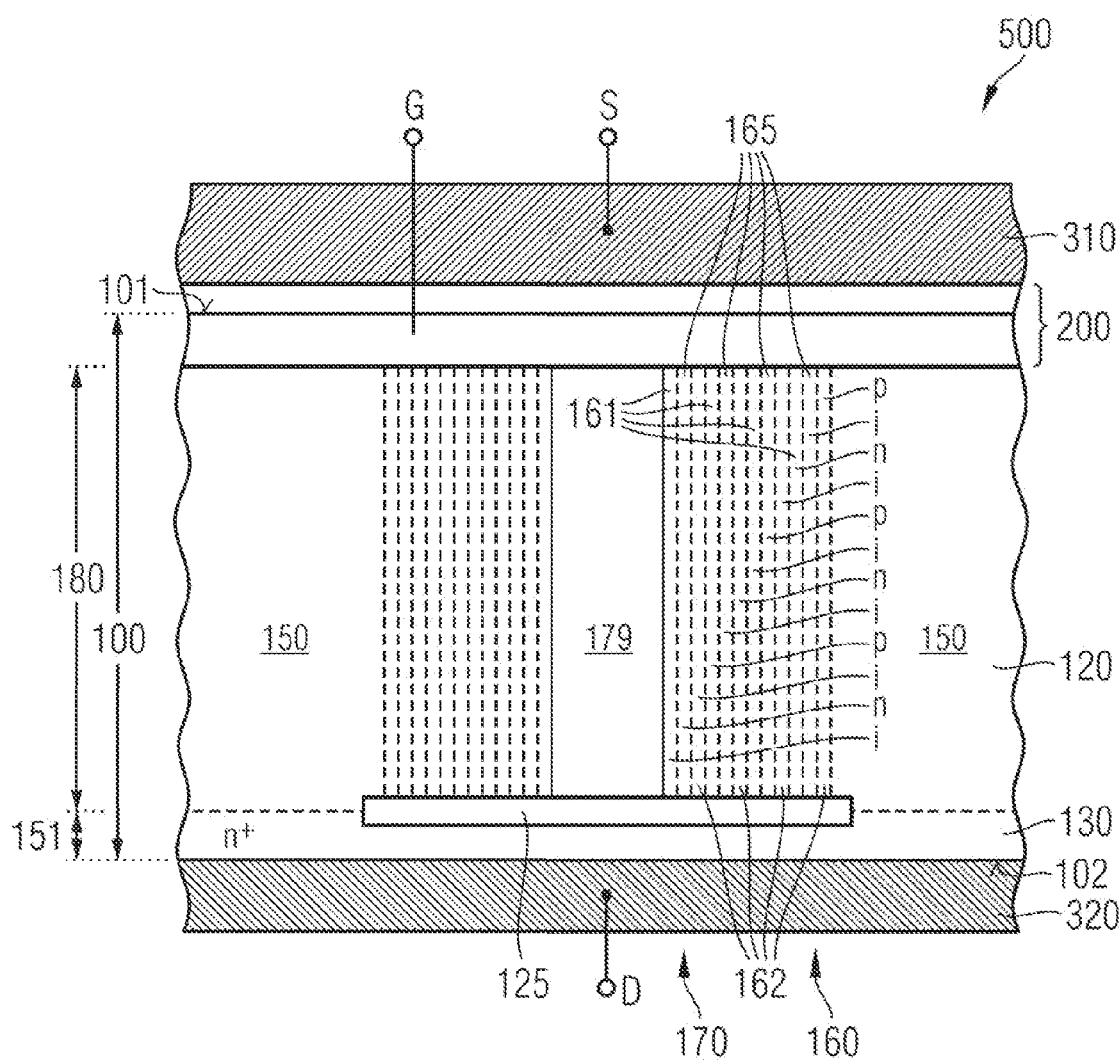
FIG. 4B is a schematic cross-sectional view of a portion of a super junction semiconductor device in accordance with another embodiment providing a compensation structure including interdiffusion layers.

FIGS. 4A to 4B refer to semiconductor devices 500 with super junction structures 180 based on compensation structures 160 including interdiffusion layers 165. A semiconductor portion 100 of the super junction semiconductor device 500 has a first surface 101 and a second surface 102 parallel to the first surface 101.

The semiconductor portion 100 is provided from a single-crystalline semiconductor material, for example silicon Si, silicon carbide SiC, germanium Ge, a silicon germanium crystal SiGe, gallium nitride GaN or gallium arsenide GaAs. In case of a semiconductor portion 100 based on silicon Si, a distance between the first and second surfaces 101, 102 is at least 40 µm, for example at least 175 µm. The semiconductor portion 100 may have a rectangular shape with an edge length in the range of several millimeters or a circular shape with a diameter of several millimeters. The normal to the first and second surfaces 101, 102 defines a vertical direction and directions orthogonal to the normal direction are lateral directions.

The semiconductor portion 100 may include an impurity layer 130 of a first conductivity type. The impurity layer 130 may extend along a complete cross-sectional plane of the semiconductor portion 100 parallel to the second surface 102. In case the semiconductor device 500 is an IGFET (insulated gate field effect transistor), the impurity layer 130 directly adjoins the second surface 102 and a mean net impurity concentration in the impurity layer 130 is comparatively high, e.g. at least $5\times10^{18}$ cm$^{-3}$. In case the semiconductor device 500 is an IGBT (insulated gate bipolar transistor), a collector layer of a second conductivity type, which is the opposite of the first conductivity type, is arranged between the impurity layer 130 and the second surface 102 and the mean net impurity concentration in the impurity layer 130 may be between $5\times10^{12}$ and $5\times10^{16}$ cm$^{-3}$, by way of example.

The semiconductor portion 100 further includes a drift cone 120 with a super junction structure 130 between the first surface 101 and the impurity layer 130. In the drift zone 120, trench structures 170 extend along the vertical direction with sections of the semiconductor portion 100 between the trench structures 170 forming mesa regions 150. The mesa regions 150 protrude from a continuous base section 151, which includes at least a portion of the impurity layer 130 and which may include a portion of the drift layer 120 directly adjoining the impurity layer 130. The mesa regions 150 may be intrinsic, uniformly p-doped, uniformly n-doped or the impurity concentration may change gradually or in steps from p-loaded to n-loaded or vice versa. Trench structures 170 spatially separate the mesa regions 150 in at least one lateral direction parallel to the first surface 101.

In the base section 151, the drift zone 120 may include a pedestal layer of the first conductivity type directly adjoining the impurity layer 130 and being effective as field stop of buffer region.

The super junction structure 180 is based on a layered compensation structure 160, which includes at least two first compensation layers 161 of the first conductivity type and at least two second compensation layers 162 of the second conductivity type, wherein the compensation layers 161, 162 are grouped in pairs of one first 161 and one second compensation layer 162. The number of layer pairs may be between 5 and 10, for example, to achieve a significant reduction of the on state or forward resistance at comparatively low costs.

The compensation layers 161, 162 are at least approximately conformal layers, each layer having an approximately uniform thickness. Interfaces between the layers of the compensation structure 160 are parallel or approximately parallel to an interface between the compensation structure 160 and the material of the semiconductor portion 100. The compensation layers 161, 162 may be single crystalline semiconductor layers grown by epitaxy with their crystal lattice growing in registry with a crystal lattice of the single crystalline semiconductor material of the semiconductor portion 100. According to other embodiments, the compensation layers 161, 162 may be formed by re-crystallization of deposited semiconductor material, for example polycrystalline silicon, using a locally effective heating treatment.

The first and second compensation layers 161, 162 may be in-situ doped during epitaxial growth. According to other embodiments, impurities of the first and second conductivity type may be introduced into initially intrinsic layers, e.g., by using tilted implants or by ALD (atomic layer deposition) for depositing mono molecular layers containing the impurities and annealing the deposited layers. The first and second compensation layers 161, 162 are in substance charge balanced and the lateral area densities deviate from each other by at most 10%. The first compensations layers 161 having the same conductivity type as the impurity layer 130 carry the on-state or forward current in the conductive state. Both the first and the second compensation layers 161, 162 are fully depleted in the reverse blocking state.

The compensation structure 160 covers at least straight portions of mesa sidewalls of the mesa regions 150 perpendicular or tilted to the first surface 101 and bottom portions of the trench structures 170 on the base section 151 between the mesa regions 150, wherein the bottom portions may be curved or approximately planar. The compensation structure 160 may cover end faces of the mesa regions 150 parallel to the first surface.

The trench structures 170 may be parallel stripes arranged at regular distances. According to other embodiments, the cross-sectional areas of the trench structures 170 parallel to the first surface 101 may be circles, ellipsoids, ovals or rectangles, e.g., squares, with or without rounded corners and the mesa regions 150 between the trench structures 170 may be stripes or segments of a grid embedding the trench structures 170. Accordingly, the cross-sectional areas of the mesa regions 150 parallel to the first surface 101 may be circles, ellipsoids, ovals or rectangles, e.g. squares, with or without rounded corners and the trench structures 170 are segments of a grid embedding the mesa regions 150.

The thickness of the first compensation layers 161 may be at least 50 nm and at most 500 nm, by way of example, wherein the compensation layers 161, 162 of each pair may have the same thickness or may have different thicknesses. In a vertical section unit the total amount of impurities in the first compensation layer 161 may in substance correspond to the total amount of impurities in the second compensation layer 162 of the same layer pair. According to an embodiment, both the first and second compensation layers 161, 162 have a thickness of about 500 nm and a mean net impurity concentration of about $2.3\times10^{16}$ cm$^{-3}$. According to another embodiment both layers 161, 162 of each layer pair may have a thickness of about 250 nm and the same mean net impurity concentration (doping level) of about $4.5\times10^{16}$ cm$^{-3}$.

Drain connection structures 125 electrically connect the first compensation layers 161 with each other and the impurity layer 130 or a pedestal layer.

The semiconductor device 500 further includes a control structure 200 suitable for the respective type of the semiconductor device 500. In case the semiconductor device 500 is a semiconductor diode, the control structure 200 contains an electrode layer of the second conductivity type electrically connected to the second compensation layers 162. For example, the second conductivity type is the p-type and the electrode layer is a p-type anode layer connected with the p-type compensation layers 162.

In case the semiconductor device 500 is an IGFET or an IBGT, the control structure 200 includes field effect transistor structures for controlling a current flow through the semiconductor portion 100 between the first surface 101 and the second surface 102 in response to a signal applied to a gate terminal G. The control structure 200 includes conductive structures, insulating structures and doped regions formed or buried in the semiconductor portion 100 and may include conductive and insulating structures outside the semiconductor portion 100 as well. For example, the control structure may be any of the control structures of FIGS. 2A to 2C.

A first electrode structure 310 may be electrically connected to the control structure 200 at the side of the first surface 101. The first electrode structure 310 may be electrically coupled to a source terminal S in case the semiconductor device 500 is an IGFET, to an emitter terminal in case the semiconductor device 500 is an IGBT or to an anode terminal in case the semiconductor device 500 is a semiconductor diode.

A second electrode structure 320 directly adjoins the second surface 102 of the semiconductor portion 100. According to embodiments related to semiconductor diodes or IGFETs, the second electrode structure 320 directly adjoins the impurity layer 130. According to embodiments related to IGBTs, a collector layer of the second conductivity type is provided between the impurity layer 130 and the second electrode structure 320. In case the semiconductor device 500 is an IGFET, the second electrode structure 320 may be electrically coupled to a drain terminal D. In case the semiconductor device 500 is an IGBT the second electrode structure 320 may be electrically coupled to a collector terminal C. In case the semiconductor device 500 is a semiconductor diode the second electrode structure 320 may be electrically coupled to a cathode terminal.

Each of the first and second electrode structures 310, 320 may consist of or contain, as main constituent(s) aluminum Al, copper Cu, or alloys of aluminum or copper, for example AlSi, AlCu or AlSiCu. According to other embodiments, one or both of the first and second electrode structures 310, 320 may contain one or more layers with nickel Ni, titanium Ti, silver Ag, gold Au, platinum Pt and/or palladium Pd as main constituent(s). For example, at least one of the first and second electrode structures 310, 320 includes two or more sub-layers, at least one of the sub-layers containing one or more of Ni, Ti, W, Ag, Au, Pt, and Pd as main constituent(s), e.g. a silicide, a nitride and/or an alloy.

The compensation structure 160 further includes interdiffusion layers 165, for example between each pair of first and second compensation layers 161, 162, between the first and second compensation layers 161, 162 of each layer pair, between each of the doped compensation layers 161, 162, or between every pair of compensation layers 161, 162 such that each second layer in the compensation structure is an interdiffusion layer 165.

The interdiffusion layers 165 are provided from intrinsic single crystalline layers and may contain impurities of the adjoining compensation layers 161, 162 in the finalized semiconductor device 500, wherein the concentration of impurities of the first conductivity type decreases with increasing distance to an interface with an adjoining first compensation layer 161 and the concentration of impurities of the second conductivity type decreases with increasing distance to an interface with an adjoining second compensation layer 162.

The interdiffusion layers 165 may have the same thickness as the compensation layers 161, 162 or may be thinner than the compensation layers 161, 162, for example they may be about half as thick as the compensation layers 161, 162. For example, the compensation layers 161, 162 may have a thickness of about 500 nm and the interdiffusion layers 165 about 250 nm at a lateral width of the mesa regions 150 of about 2 μm.

The interfaces between the layers 161, 162, 165 of the compensation structure 160 are parallel or approximately parallel to an interface between the compensation structure 160 and the material of the semiconductor portion 100.

FIG. 4A illustrates an embodiment with the interdiffusion layers 165 provided between every pair of doped compensation layer 161, 162 resulting in a p-i-n-i-p-i-n . . . layer structure.

According to the embodiment illustrated in FIG. 4B, the first and second compensation layers 161, 162 are arranged in pairs, with the innermost compensation layer 161 oriented to the closest mesa region 150 being a second compensation layer 162 having a conductivity type opposite to that of the impurity layer 130, and with the interdiffusion layers 165 arranged between the compensation layers 161, 162 of each pair resulting in a p-i-n-p-i-n-p-i-n . . . layer sequence.

According to another embodiment, the layers of each layer pair are directly adjoining to each other and the interdiffusion layers 165 separate neighboring layer pairs, resulting in a p-n-i-p-n-i-p-n-i . . . layer sequence. Other embodiments provide a first compensation layer 161 as the innermost doped compensation layer and the interdiffusion layers 165 are provided between the layers of layer pairs or between the layer pairs.

The interdiffusion layers 165 reduce the degree of diffusion of impurities of the second conductivity type into the first compensation layers 161, which carry the on state or forward current in the conductive mode. A higher net impurity concentration in the first compensation layers 161, and hence a lower on state or forward resistance of the semiconductor device 500, can be achieved at a lower total impurity quantity. Since lower maximum impurity concentrations reduce the effect of process-induced absolute impurity concentration deviations, deviations from nominal parameters of the semiconductor device 500, for example, the breakdown voltage, can be reduced.

According to an embodiment, a method of manufacturing the compensation structures 160 of FIGS. 4A and 4B includes growing by epitaxy thin intrinsic layers and providing by ALD (atomic layer deposition) monomolecular process layers containing impurities on the intrinsic layers. The process may include activating the ALD layer, for example by a thermal treatment or anneal, for a further epitaxy process wherein the complete impurity quantity remains localized close to the interface between the two epitaxial layers. ALD allows a very thin layer thickness for the first and second compensation layers 161, 162 at high impurity concentrations.

The super junction semiconductor device 500 of FIG. 5 includes a cell area 610 and an edge area 690 surrounding the cell area 610 in lateral directions with respect to a first surface 101 of a semiconductor portion 100. The cell area 610 includes mesa regions 150 protruding from a base section 151. First trench structures 170a spatially separate the mesa regions 150 in at least one of the lateral directions. The cell area 610 may have any of the configurations described with reference to one of the preceding figures.

In the edge area 690, a termination region 152 protrudes from the base section 151. A second trench structure 170b spatially separates the termination region 152 in the lateral direction from the closest mesa region 150 in the cell area 610. The termination region 152 may include further doped, conductive or insulator structures. The termination region 152 may directly adjoin an edge surface 103 connecting the first surface 101 with a second, parallel surface 102 of the semiconductor portion 100. According to an embodiment, the termination region 152 is an intrinsic or lightly doped segment of the semiconductor portion 100. The second trench structures 170b have a second width w2 wider than a first width w1 of the first trench structures 170a. The second trench structures 170b may have the same vertical extension as the first trench structures 170a, or a greater vertical extension.

The semiconductor portion 100 includes an impurity layer 130 of a first conductivity type on the side of the second surface 102 and a drift layer 120 containing a super junction structure 180 based on a compensation structure 160 with at least one, e.g., at least two, first compensation layer 161 of the first conductivity type and least one, e.g., at least two, second compensation layer 162 of a complementary second conductivity type. The compensation structure 160 covers the sidewalls of both the mesa regions 150 and the termination region 152.

As regards the second trench structure 170b, the second compensation layers 162 of a segment of the compensation structure 160 directly adjoining the neighboring mesa region 150 are electrically connected to the first electrode structure 310, for example through body zones contained in the control structure 200, whereas in the edge area 690 the first compensation layers 161 of the corresponding segment of the compensation structure 160 lining the sidewall of the termination region 152 are electrically connected to an auxiliary electrode structure 321, for example through one or more heavily doped contact zones 154 of the first conductivity type formed in the termination region 152 along the first surface 101. The second compensation layers 162 of the edge area 690 may float or may be connected to the auxiliary electrode structure 321, for example through one or more heavily doped contact zones of the second conductivity type formed in the termination region 152 along the first surface 101 in a plane parallel to the cross-sectional plane.

The auxiliary electrode structure 321 directly adjoins at least sections of a portion of the first surface 101 in the edge area 690, is dielectrically insulated from the first electrode structure 310, and is electrically connected with the second electrode structure 320 through the first compensation layers 161 in the edge area 690.

When a reverse blocking voltage is applied between the first electrode structure 310 and the second electrode structure 320, resulting equipotential lines 198 are parallel to the first surface 101 in the cell area 610, where the second compensation layers 162 are electrically connected to the first electrode structure 310. In addition, the electric field is accommodated in the lateral direction in the second trench structure 170b between the segment of the compensation structure 160 adjoining the outermost mesa region 150 and the segment of the compensation structure 160 lining the sidewall of the termination region 152. As a result the outer edge 103, which is subjected to a separation process that often damages the crystal lattice along the outer edge 103, is free of equipotential lines and electric fields. Device reliability and long term stability is improved.

FIGS. 6A to 6F illustrate a method of manufacturing a super junction semiconductor device 500 with a drain connection structure 125. A semiconductor substrate 505 with a first surface 101 and a second surface 102 parallel to the first surface 101 is provided from a single crystalline semiconductor material. The semiconductor material may be, for example silicon Si, silicon carbide SiC, germanium Ge, a silicon germanium crystal SiGe, gallium nitride GaN or gallium arsenide GaAs, by way of example. The semiconductor substrate 500 may be a homogeneous substrate from the semiconductor material, e.g. a silicon wafer, or a multi-material substrate with the semiconductor material provided as a semiconductor layer over a non-semiconducting carrier substrate provided, for example, from a silicon oxide or glass, e.g. a SOI (silicon-on-insulator) wafer. The semiconductor substrate 505 may include a heavily doped substrate portion 130x and a lightly doped or intrinsic drift portion 120x. The drift portion 120x and the substrate portion 130x form an interface parallel to the first and second surfaces 101, 102.

From the first surface 101, trenches 170x are introduced, for example etched, into the drift portion 120x. The trenches 170x may be spaced from the substrate portion 130x, may reach an interface between the drift portion 120x and the substrate portion 130x, or may extend into the substrate portion 130x. Heavily doped single crystalline first compensation layers 161 of the first conductivity type, second compensation layers 162 of the complementary second conductivity type, and at least initially intrinsic interdiffusion layers 165 are sequentially provided, e.g., by epitaxy.

According to an embodiment, the first and second compensation layers 161, 162 are in-situ doped layers grown by epitaxy with the crystal lattice of the compensation and interdiffusion layers 161, 162, 165 growing in registry with the crystal lattice of the semiconductor substrate 505. According to other embodiments, the first and second compensation layers 161, 162 result from an ALD process using precursor materials containing the impurities. The process may further include modifying the surface of the deposited ALD layers such that a further layer can be grown by epitaxy after the ALD.

ALD produces continuous monomolecular layers of the deposited material such that the impurity concentration can be adjusted very precisely. With ALD, very thin first and second compensation layers 161, 162 may be provided at high and precisely tuned impurity concentrations. The compensation structure 160 may be densely packed such that the on state or forward resistance in a conductive state is low.

According to the illustrated embodiment, the compensation, and interdiffusion layers 161, 162, 165 are either barred from growing on or removed from the end surfaces of the mesa regions 150. Other embodiments may provide remnant portions of the compensation and interdiffusion layers 161, 162, 165 on the end surfaces of the mesa regions 150.

Figure 6A:
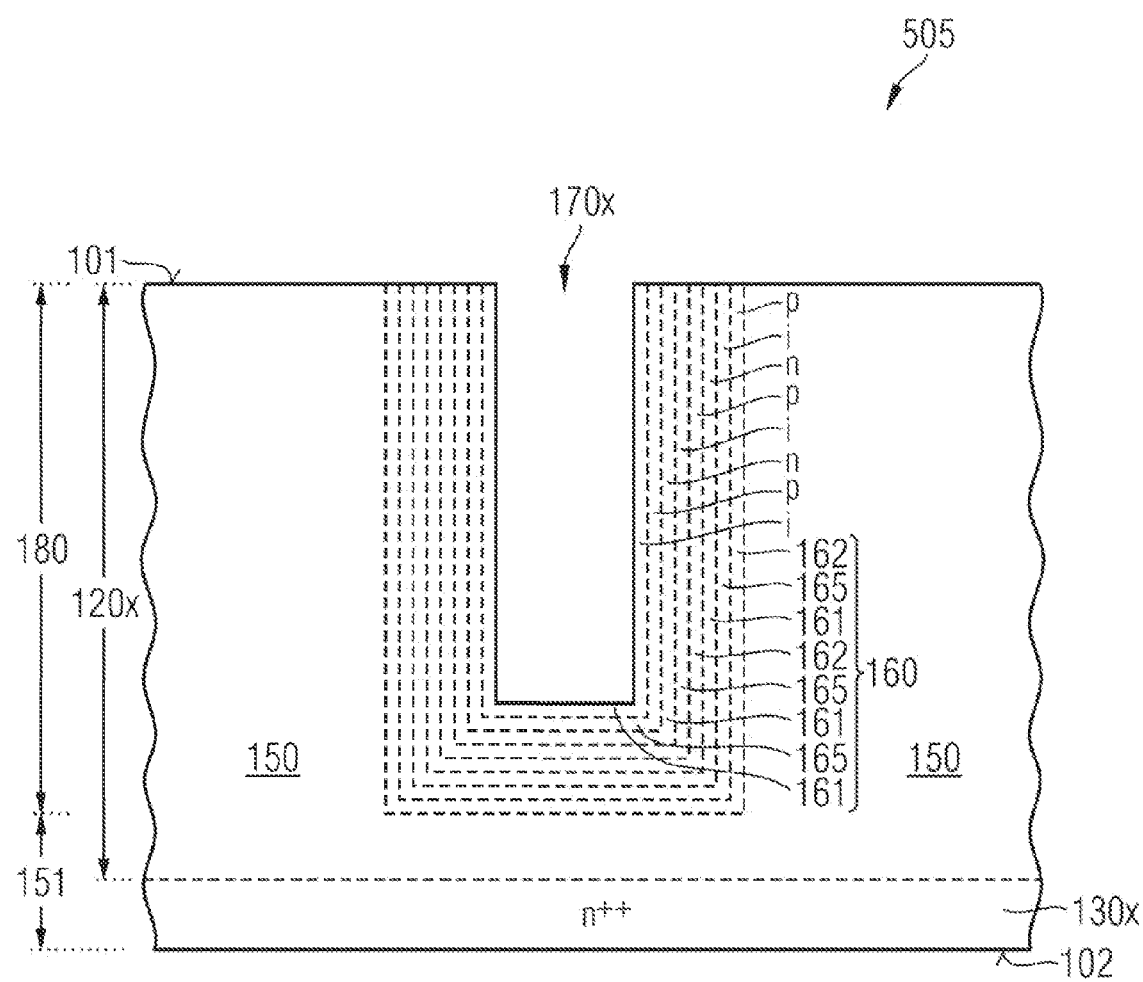
FIG. 6A is a schematic cross-sectional view of a portion of a semiconductor substrate for illustrating a method of manufacturing a super junction semiconductor device with a drain connection structure after depositing layers of a compensation structure and an intermediate layer.

FIG. 6A shows portions of a compensation structure 160 including first compensation layers 161, second compensation layers 162 and interdiffusion layers 165 covering the semiconductor substrate 505 thereby lining sidewalls of mesa regions 150 protruding from a base section 151 and portions of the base section 151 between the mesa regions 150.

In the illustrated embodiment, the interdiffusion layers 165 separate the first and second compensation layers 161, 162 of each pair of oppositely doped first and second compensation layers 161, 162. Other embodiments may provide the interdiffusion layers 165 between all doped layers of the compensation structure 160 or may provide the compensation structure 160 without interdiffusion layers 165. The sidewalls of the trenches 170x may be perpendicular to the first surface 101 or may taper with increasing distance to the first surface 101 and transition sections between horizontal and tilted sections of the compensation structure 160 may be rounded.

A mask liner 191a may be provided that covers the surface of the compensation structure 160. The mask liner 191a may be a conformal layer with approximately uniform thickness. The mask liner 191a may be provided from any material against which the compensation structure 160 can be selectively etched. For example, the mask liner 191a may be a carbon layer, a photo resist layer or a dielectric layer, for example a thermally grown or deposited oxide, nitride, or oxynitride.

An auxiliary mask 192 is provided that covers horizontal sections of the mask liner 191a parallel to the first surface 101 outside the trenches 170x. The auxiliary mask 192 may result from a low-conformally deposited material that predominantly deposits on the horizontal surfaces outside the trenches 170x. The auxiliary mask 192 may be provided from a deposited silicon oxide, for example from an oxide deposited using PECVD (plasma enhanced chemical vapor deposition).

Figure 6B:
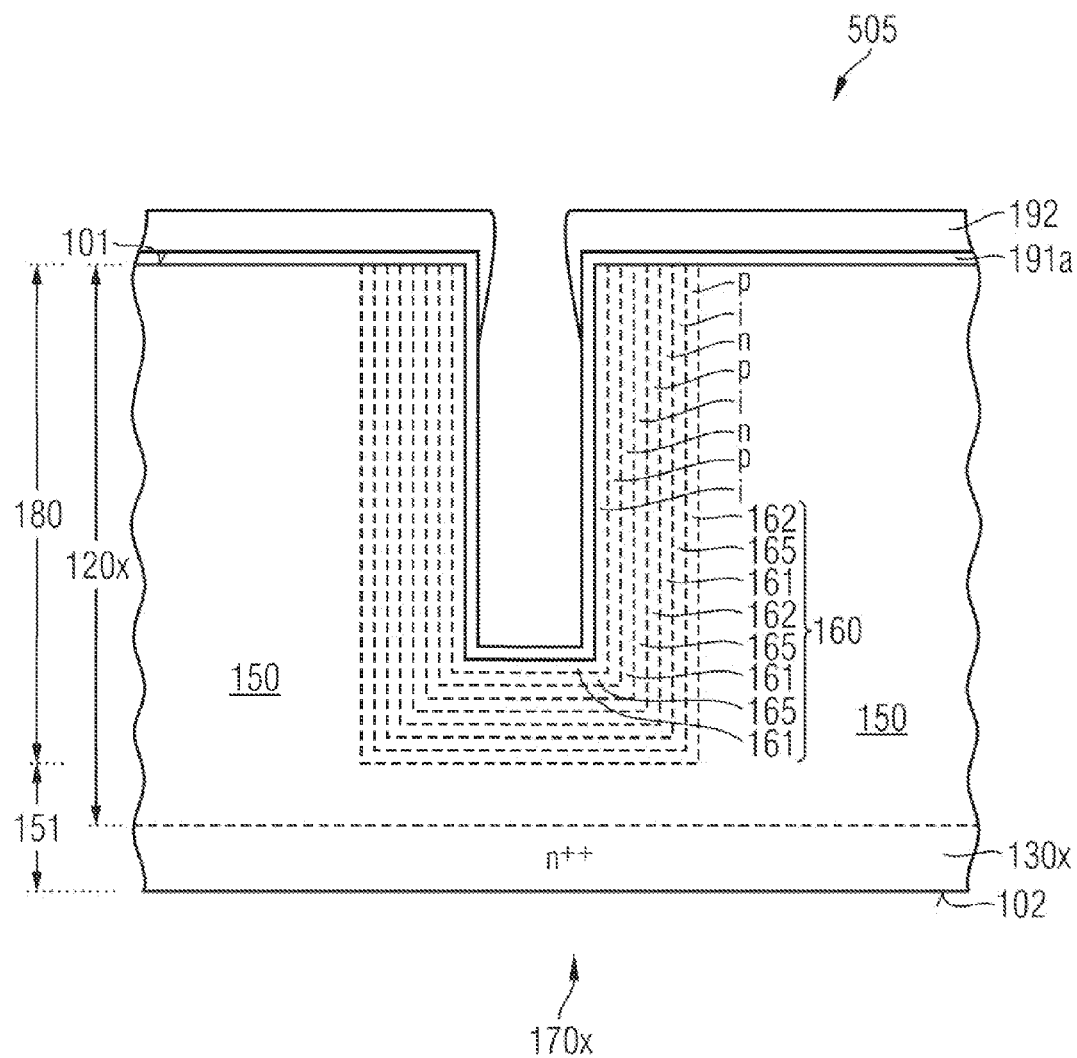
FIG. 6B shows the semiconductor substrate of FIG. 6A after providing a non-conformal auxiliary mask.
Figure 6D:
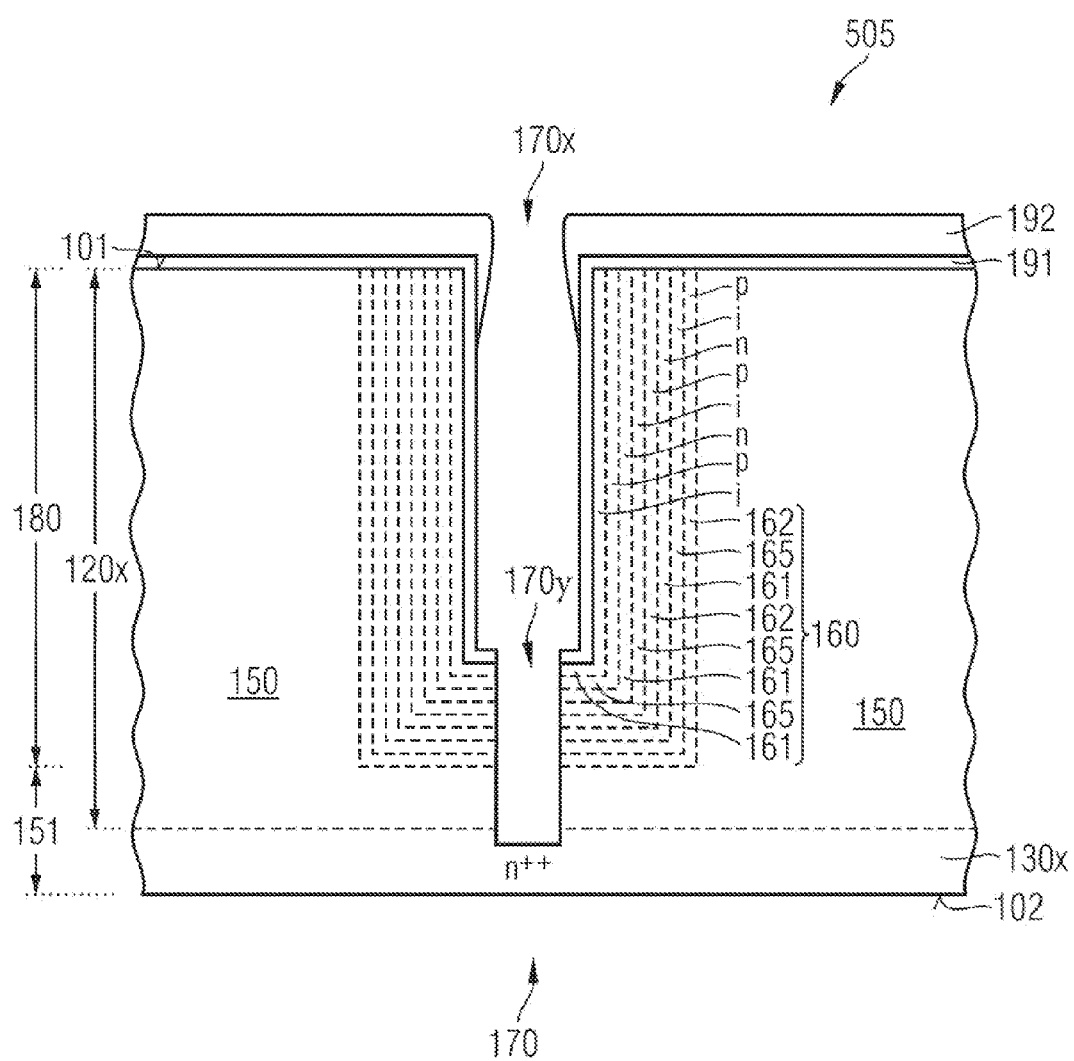
FIG. 6D shows the semiconductor substrate of FIG. 6C after etching through the compensation structure using the etch mask.

FIG. 6B shows the auxiliary mask 192 covering horizontal portions of the mask liner 191a on portions of the compensation structure 160 covering the mesa portions 150 outside the trenches 170x. Sections of the mask liner 191a exposed by the auxiliary mask 192 on portions of the compensation structure 160 covering the bottom of the trenches 170x are removed, for example by a directed plasma etch process.

FIG. 6C shows an etch mask 191 resulting from the mask liner 191a. Using the etch mask 191, an auxiliary trench 170y is etched through the compensation structure 160, for example using a directed plasma etch process.

FIG. 6b shows segments of the compensation structure 160 with exposed buried lateral faces cutting the first and second compensation layers 161, 162 and the interdiffusion layers 165 in the auxiliary trench 170y between the mesa regions 150, wherein end faces of the compensation layers 161, 162 are exposed. The etch may reach the heavily doped substrate portion 130x.

A drain connection structure 125 is provided in the auxiliary trench 170y. For example, a heavily in-situ doped layer of the first conductivity type is grown by epitaxy selectively on the exposed buried lateral faces of the compensation structure 160 in the auxiliary trenches 170y using the etch mask 191 as an epitaxy mask. The heavily doped layer may fill the auxiliary trench 170y completely or may line the auxiliary trench 170y leaving a remaining space unfilled. Thickness and impurity concentration in the grown drain connection structure 125 can be selected independently from the amount of impurities in the compensation layers 161, 162 of the compensation structure 160. Portions of the etch mask 191 in the trenches 176x may form at least a portion of a dielectric layer sealing the compensation structure 160 against a remaining void or filling the trenches 170x.

Figure 6E:
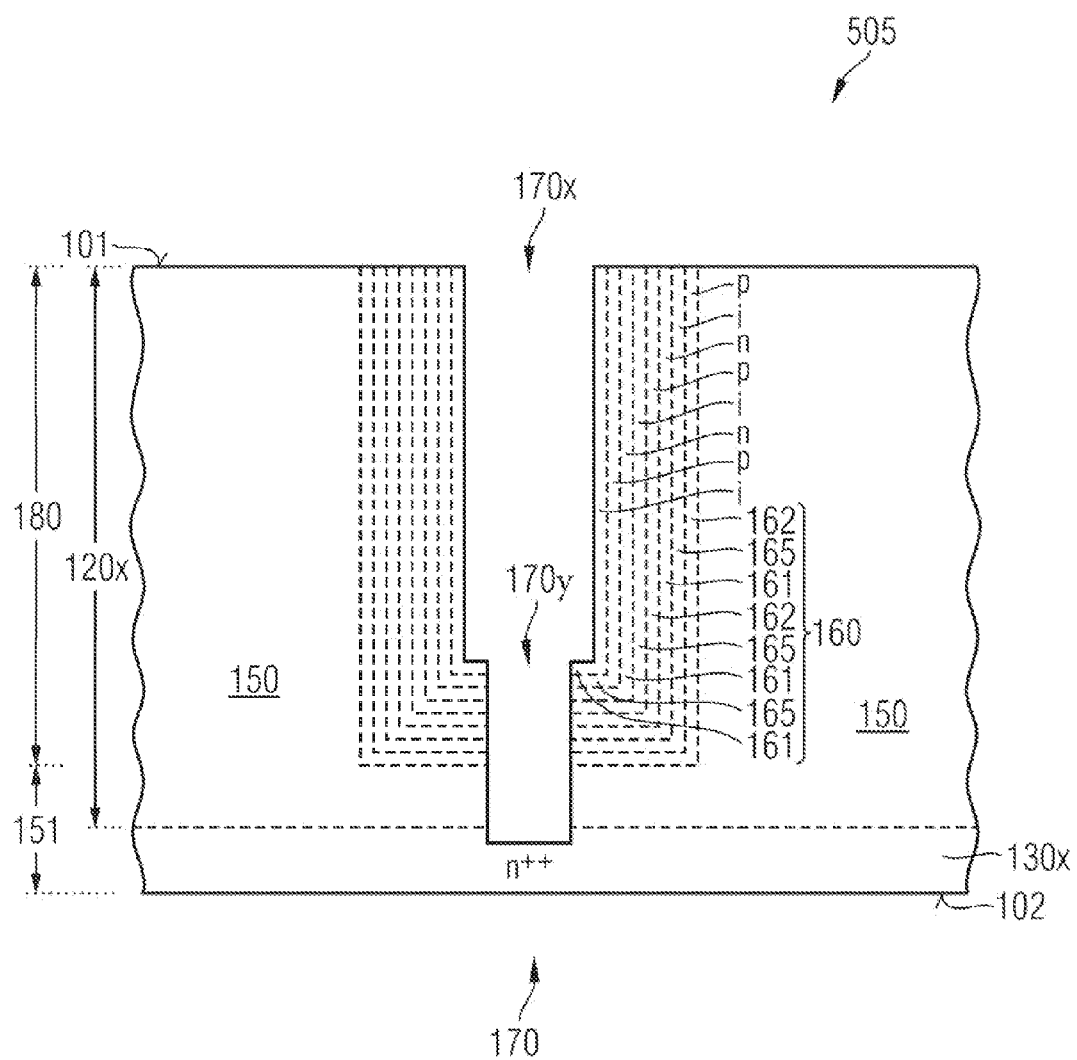
FIG. 6E shows the semiconductor substrate of FIG. 6D after removing the auxiliary mask.
Figure 6F:
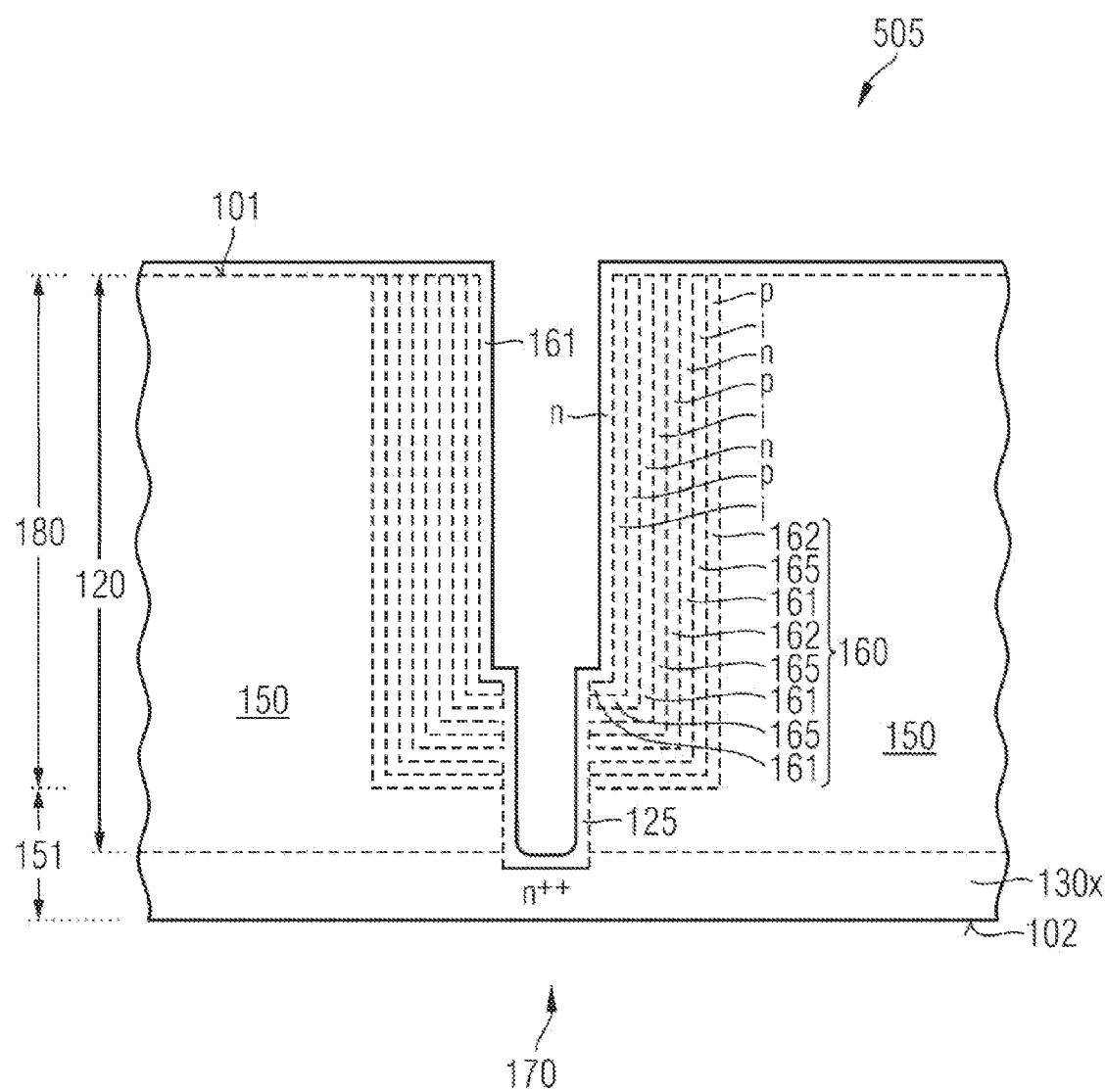
FIG. 6F shows the semiconductor substrate of FIG. 6E after providing a further layer of the compensation structure and the drain connection structure.

According to the embodiment illustrated in FIGS. 6E and 6F, the auxiliary mask 192 and the etch mask 191 are removed after etching the auxiliary trench 170y as shown in FIG. 6E.

A layer of the first conductivity type is deposited that covers the compensation structure 160 in the trench 170x and the auxiliary trench 170y. Portions of the deposited layer in the auxiliary trench 170y and covering the buried lateral faces of the compensation structure 160 form the drain connection structure 125. Portions of the layer outside the auxiliary trench 170y form a first compensation layer 161, for example the outermost first compensation layer of the compensation structure 160 as shown in FIG. 6F. The deposited layer may be the final layer. According to other embodiments, an intrinsic layer and/or a further second compensation layer 162 may be provided covering the previously provided layer. The layers may be grown by epitaxy.

Providing an intrinsic single crystalline or polycrystalline semiconductor material or a dielectric material may complete filling of the trenches 170x. Alternatively, the segments of the compensation structure 160 in the trenches 170x, 170y may be lined with a dielectric material such that voids remain at least in the trenches 170x.

Further process steps for obtaining transistor cells with the first compensation layers 161 being effective as a portion of the drain structure of the transistor cells and for providing electrode structures may follow. A plurality of identical semiconductor devices 500 is obtained from the semiconductor substrate 505 by singularizing wherein from the substrate portion 130x the impurity layers 130 and from the drift portion 120x the drift layers 120 as described with reference to the previous Figures may emerge, by way of example.

Figure 7A:
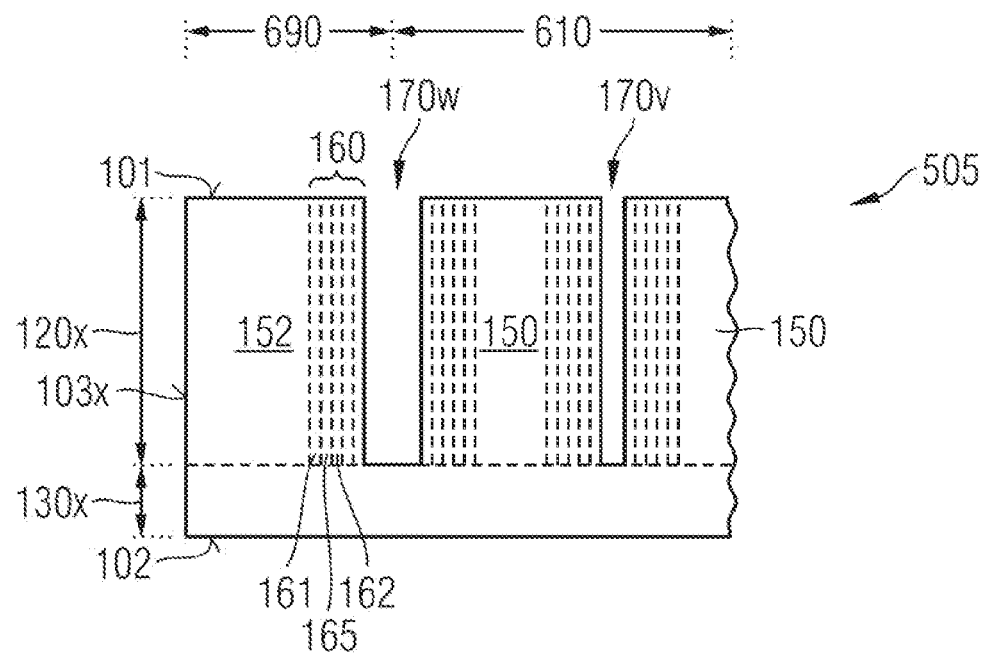
FIG. 7A is a schematic cross-sectional view of a portion of a semiconductor substrate for illustrating a method of manufacturing a super junction semiconductor device with a termination structure after providing compensation layers.

FIG. 7A provides a semiconductor substrate 505 with a substrate portion 130x and a drift portion 120x forming an interface parallel to a first and a second surface 101, 102 of the semiconductor substrate 505. Trenches 170v, 170w are introduced into the drift portion 120x from the first surface 101, wherein the trenches 170v, 170w reach and may cut the interface between the drift portion 120x and the substrate portion 130x. First trenches 170v in a cell area 610 are narrower and may be shallower than second trenches 170w in an edge area 690 between the cell area 610 and a kerf area 103x along which the semiconductor substrate 505 is sawn or cut when a plurality of identical semiconductor dies is obtained from the finalized semiconductor substrate 505.

A compensation structure 160 comprising a plurality of first and second compensation layers 161, 162 of the first and second conductivity type is provided that covers mesa sidewalls of mesa regions 150 that protrude from a base portion, which includes at least portions of the substrate portion 130x, and that are separated by the first trenches 170v.

FIG. 7A shows a portion of a semiconductor substrate 505 including a cell area 610 and an edge area 690 of a semiconductor die. Trenches 170v, 170w extend from the first surface 101 into the drift portion 120x. In the cell area 610, first trenches 170v separate neighboring mesa regions 150. The edge area 690 includes a termination region 152. The second trench 170w separates the termination region 152 from the neighboring outermost mesa region 150 of the cell area 610. Segments of a compensation structure 160 line vertical sidewalls of the mesa regions 150 and the termination region 152.

A masking process protects the cell area 610 against the following processing of the edge area 690, for example by closing or filling completely a remaining gap in the first trenches 170v. For example, a fill layer 126 may be grown by epitaxy or deposited such that the fill layer 126 fills or closes the remaining gaps in the first trenches 170v and only lines and leaves open the remaining gap in the second trench 170w. According to an embodiment, the fill layer 126 is an intrinsic layer grown by epitaxy, wherein the width of the fill layer 126 is selected to completely fill the remaining gaps in the first trenches 170v and to not completely fill the remaining gaps in the second trenches 170w.

Figure 7B:
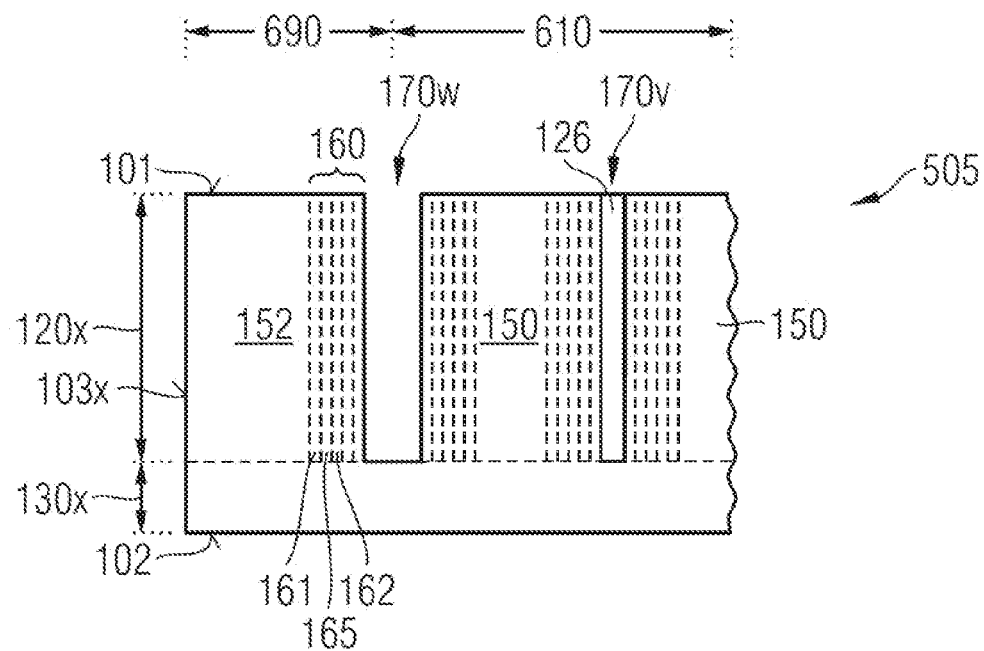
FIG. 7E shows the semiconductor substrate of FIG. 7A after closing first trench structures in the cell area using a fill layer.
FIG. 7C shows the semiconductor substrate of FIG. 7B after providing a correction layer.
FIG. 7D shows the semiconductor substrate of FIG. 7C after depositing a mask liner.
FIG. 7F shows the semiconductor substrate of FIG. 7E after providing a dielectric material partially filling a trench in an edge area.

FIG. 7B shows the intrinsic fill layer 126 lining the second trench 170w and completing the fill of the first trenches 170v. A dielectric layer may be provided to cover and protect the compensation structure 160 in the edge area 690. A remaining gap in the second trench 170w may remain unfilled or may be filled with a dielectric material, for example BSG (boron silicate glass), PSG (phosphorus silicate glass), BPSG (boron phosphorus silicate glass) or polyimide.

According to the illustrated embodiment, a correction layer 127 may be deposited on the fill layer 126. The correction layer 127 may be lightly p-doped to compensate, in the depleted state, positive surface charges in the dielectric material finally covering the compensation structure 160.

Figure 7C:
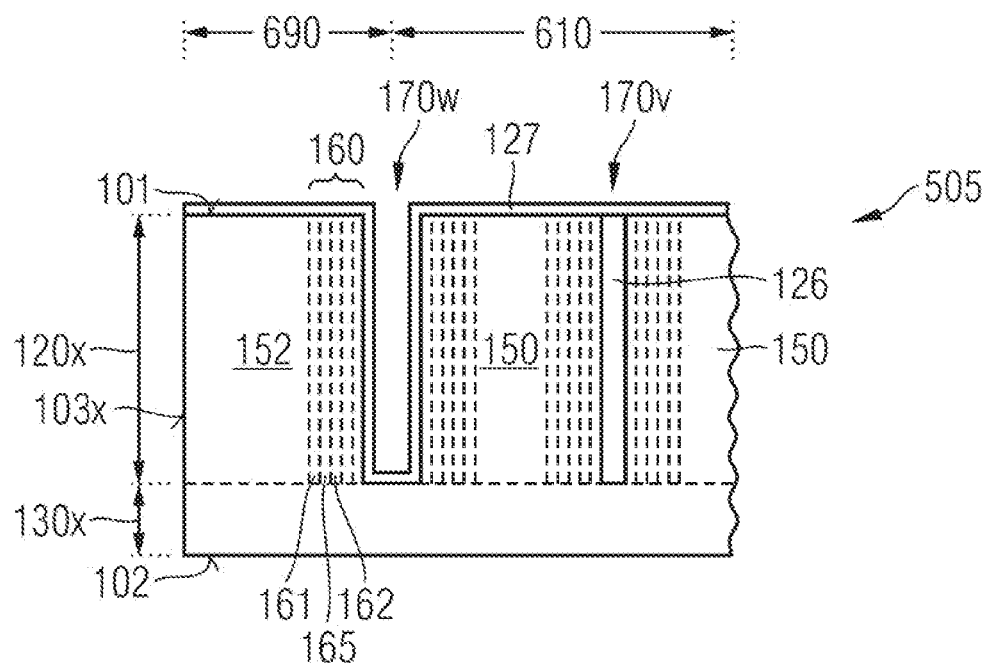

FIG. 7C shows the correction layer 127 covering the fill layer 126.

Figure 7D:
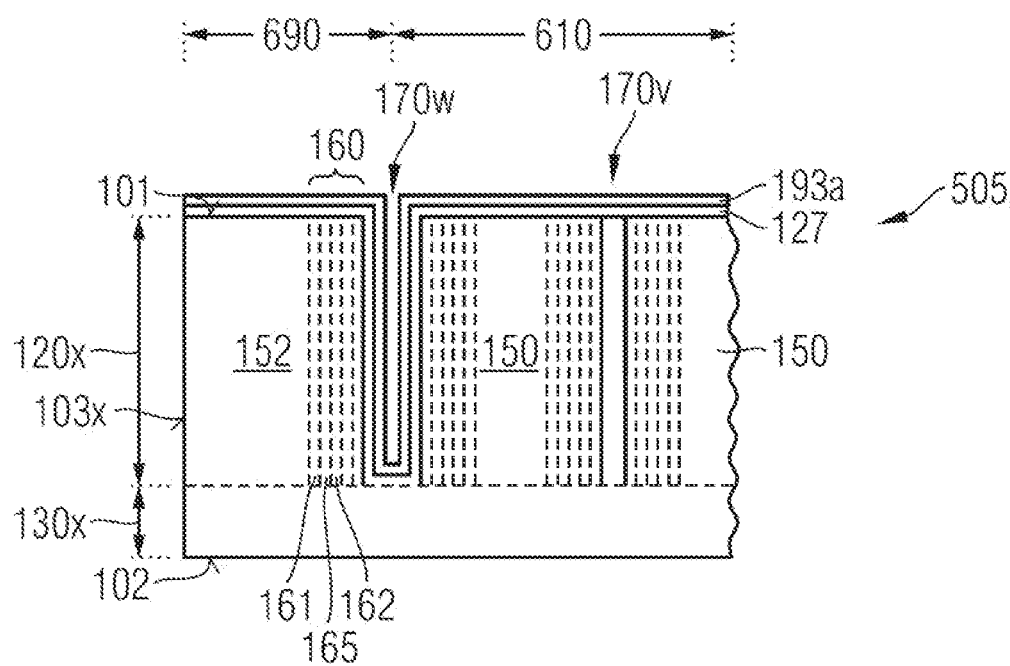
Figure 7E:
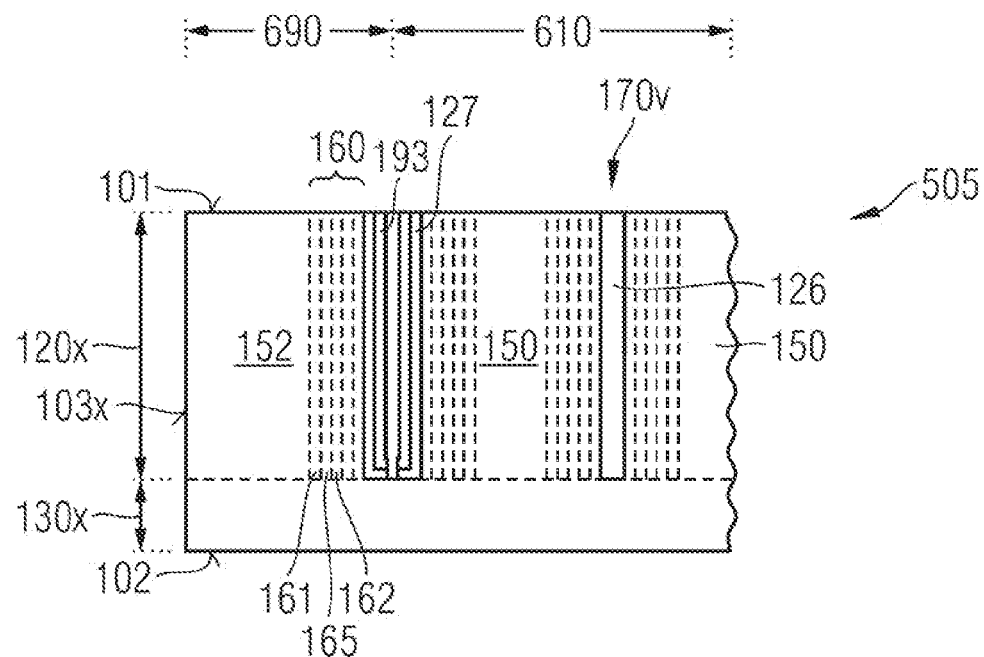

A mask liner 193a may be deposited and patterned by an anisotropic spacer etch to form a spacer mask 193 shown in FIGS. 7D and 7E.

Figure 7F:
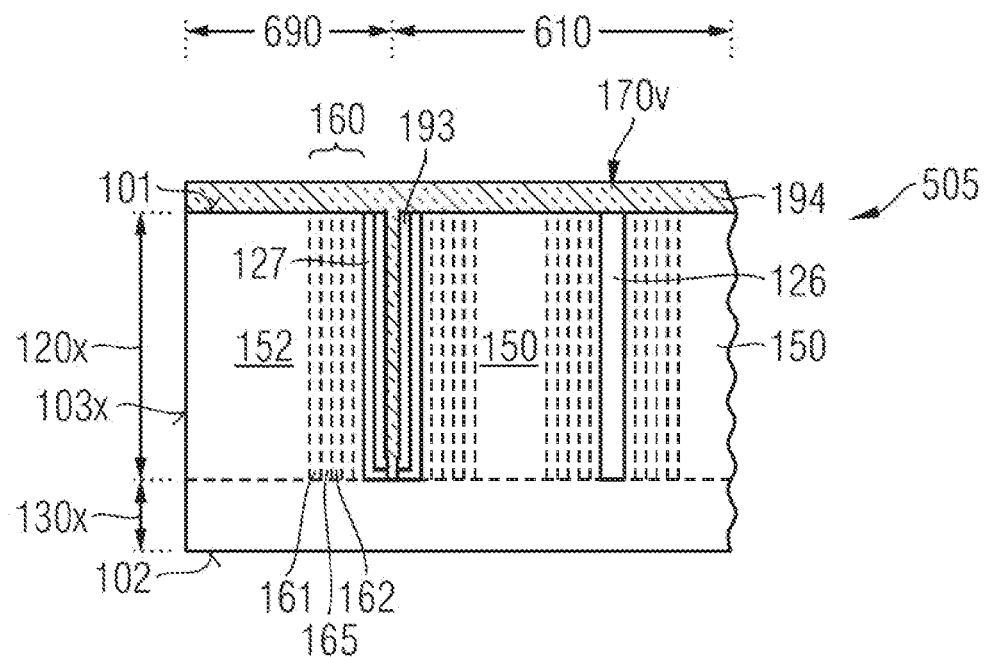

Using the spacer mask 193 as an etch mask, in an exposed section the correction layer 127 is cut through at the trench bottom of the second trench 170w to electrically separate the segments of the compensation structure 160 in the cell and edge areas 610, 690. A further dielectric material 194 may be deposited that fills the second trench 170w completely or leaves voids in the second trenches as shown in FIG. 7F.

Figure 8A:
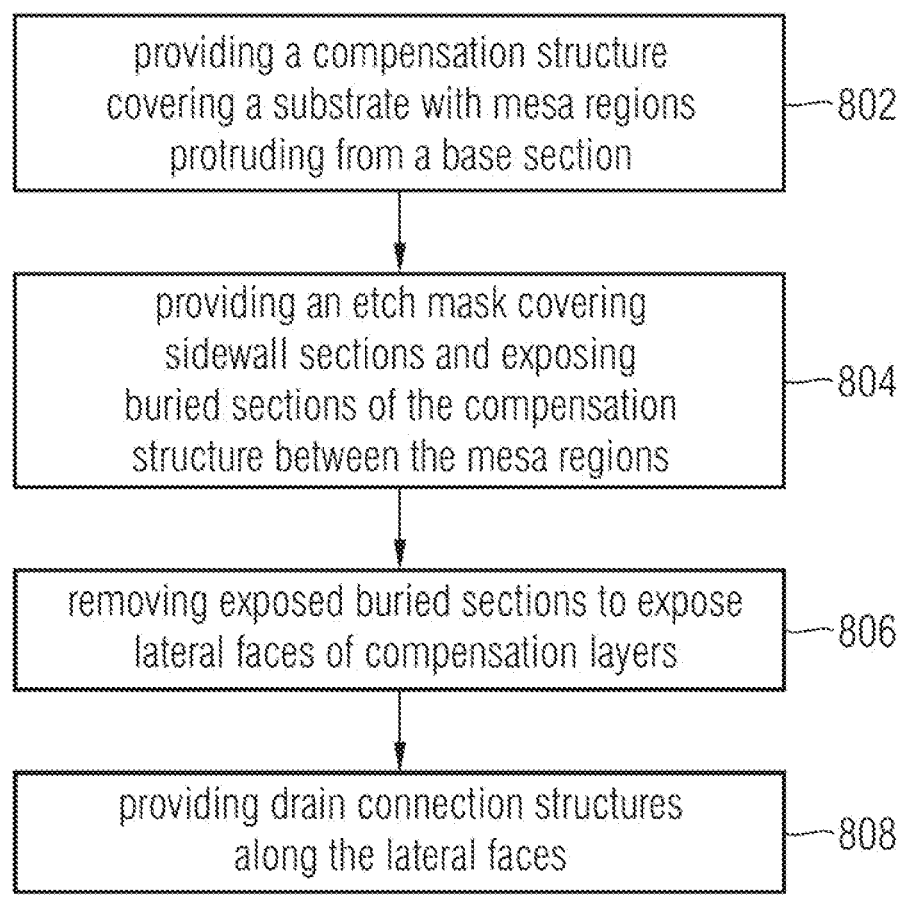
FIG. 8A is a simplified flow chart of a method of manufacturing a super junction semiconductor device according to an embodiment providing a drain connection structure.

FIG. 8A refers to a method of manufacturing a super junction semiconductor device with a drain connection structure. At least two first compensation layers of a first conductivity type and at least two second compensation layers of a complementary second conductivity type are provided to form a compensation structure covering a semiconductor substrate with mesa regions that protrude from a base section and that are spatially separated in a lateral direction parallel to a first surface of the semiconductor substrate (802). An etch mask is provided that covers sidewall sections of the compensation structure along the sidewalls of the mesa regions and that exposes a buried section of the compensation structure on the base section between the mesa regions (804). The exposed buried section of the compensation structure is removed, wherein buried lateral faces of the compensation structure cutting the first and second compensation layers are exposed between the mesa regions (806). Drain connection structures of the first conductivity type are provided that extend along the buried lateral faces and that structurally connect the first compensation layers (808).

Figure 8B:
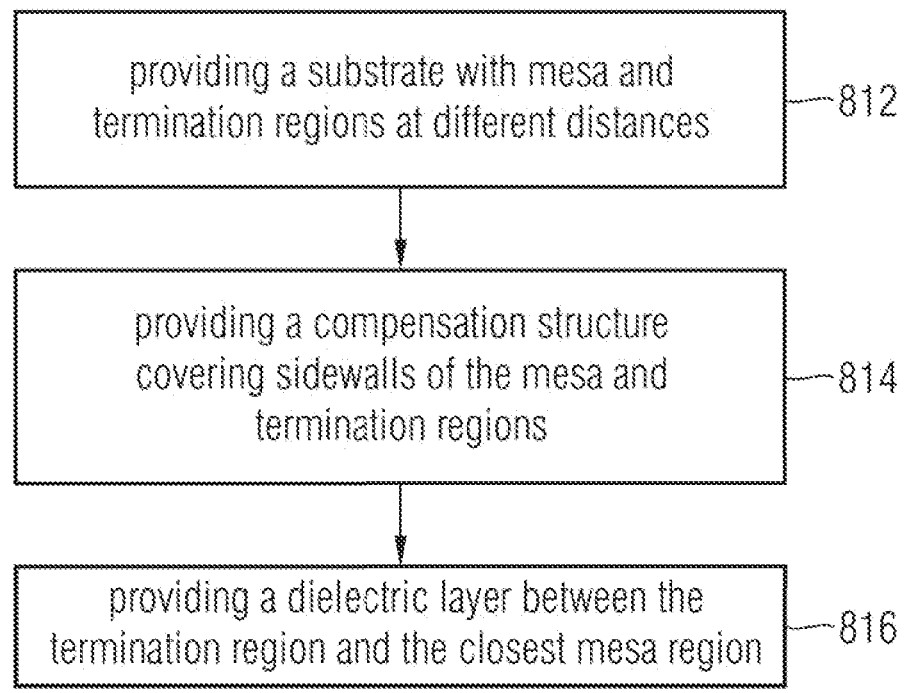
FIG. 8B is a simplified flow chart of a method of manufacturing a super junction semiconductor device according to an embodiment providing a termination structure.

FIG. 8B refers to a method of manufacturing a super junction semiconductor device with cell and edge areas. A semiconductor substrate with mesa and termination regions protruding from a base section is provided, wherein the mesa regions are spatially separated by a first distance in a cell area and a termination region in an edge area surrounding the cell area is separated by a closest one of the mesa regions at a second distance greater than the first distance (812). At least one compensation layer of a first conductivity type and at least one second compensation layer of a complementary second conductivity type are provided to form a compensation structure covering the mesa and termination regions (814). A dielectric layer that is absent between the mesa regions is provided between the termination region and the closest mesa region (816).

According to an embodiment, at least two first compensation layers of the first conductivity type and at least two second compensation layers of the second conductivity type are provided.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A super junction semiconductor device, comprising:
    a semiconductor portion comprising mesa regions protruding from a base section and spatially separated in a lateral direction parallel to a first surface of the semiconductor portion; and
    a compensation structure covering at least sidewalls of the mesa regions, the compensation structure comprising at least two first compensation layers of a first conductivity type, at least two second compensation layer of a complementary second conductivity type, and at least one interdiffusion layer between one of the first and one of the second compensation layers, wherein
    the compensation structure covers portions of the end faces of the mesa regions,
    surficial lateral faces of the compensation structures cut the first and second compensation layers in a vertical projection of the mesa regions, and
    the super junction semiconductor device comprises body zones of the second conductivity type extending along the surficial lateral faces and structurally connecting the second compensation layers.

2. The super junction semiconductor device of claim 1, wherein
    the compensation structure covers portions of the base section and buried lateral faces of the compensation structure cut the first and second compensation layers between the mesa regions, and
    the super junction semiconductor device comprises drain connection structures of the first conductivity type extending along the buried lateral faces and structurally connecting the first compensation layers.

\* \* \* \* \*

UNITED STATES PATENT AND TRADEMARK OFFICE
CERTIFICATE OF CORRECTION

PATENT NO. : 9,570,596 B2  
APPLICATION NO. : 14/679483  
DATED : February 14, 2017  
INVENTOR(S) : S. Gamerith et al.

Page 1 of 1

It is certified that error appears in the above-identified patent and that said Letters Patent is hereby corrected as shown below:

In the Claims

Claim 1 (Column 22, Line 24), please change "layer" to --layers--.

Signed and Sealed this  
Eighteenth Day of April, 2017

Michelle K. Lee  
*Director of the United States Patent and Trademark Office*